United States Patent
Okumura

(10) Patent No.: US 10,998,410 B2
(45) Date of Patent: May 4, 2021

(54) SEMICONDUCTOR DEVICE

(71) Applicant: FUJI ELECTRIC CO., LTD., Kawasaki (JP)

(72) Inventor: Keiji Okumura, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 79 days.

(21) Appl. No.: 16/579,123

(22) Filed: Sep. 23, 2019

(65) Prior Publication Data
US 2020/0152748 A1 May 14, 2020

(30) Foreign Application Priority Data
Nov. 8, 2018 (JP) .............................. JP2018-210949

(51) Int. Cl.
*H01L 29/417* (2006.01)
*H01L 29/78* (2006.01)
*H01L 29/423* (2006.01)

(52) U.S. Cl.
CPC .... *H01L 29/41725* (2013.01); *H01L 29/4236* (2013.01); *H01L 29/7813* (2013.01)

(58) Field of Classification Search
None
See application file for complete search history.

(56) References Cited

U.S. PATENT DOCUMENTS

2006/0081919 A1    4/2006  Inoue et al.
2017/0141223 A1*   5/2017  Hoshi .................. H01L 29/7813
2018/0350976 A1*  12/2018  Okumura ............ H01L 29/1079

FOREIGN PATENT DOCUMENTS

JP    2006-120789 A    5/2006

* cited by examiner

*Primary Examiner* — Dung A. Le

(57) ABSTRACT

In a trench-gate MOSFET, between a channel and an $n^+$-type source region, an n-type shunt resistance region is provided in contact with the $n^+$-type source region and the channel. The $n^+$-type source region is disposed at a position separated from a gate insulating film at a side wall of a trench, in a direction parallel to a front surface of a semiconductor substrate. The n-type shunt resistance region is disposed, positioned deeper toward a drain electrode than is a front surface of the semiconductor substrate and shallower toward a source electrode than is the channel, and reaches a position deeper toward the drain electrode from the front surface of the semiconductor substrate than is the $n^+$-type source region. The n-type shunt resistance region is a resistor for reducing current between the drain and the source when a large current exceeding a rated current flows during a short circuit.

14 Claims, 18 Drawing Sheets

SEMICONDUCTOR DEVICE

CROSS REFERENCE TO RELATED APPLICATIONS

This application is based upon and claims the benefit of priority of the prior Japanese Patent Application No. 2018-210949, filed on Nov. 8, 2018, the entire contents of which are incorporated herein by reference.

BACKGROUND

1. Field

Embodiments discussed herein relate to a semiconductor device.

2. Description of Related Art

Conventionally, a trench-gate structure is a three-dimensional structure in which a MOS gate (insulated gate formed by a metal, an oxide film, and a semiconductor material) is embedded in a trench formed in a semiconductor substrate, and a portion along a trench side wall is used as a channel (inversion layer). Therefore, a trench-gate structure enables a chip area and/or ON resistance to be reduced as compared to a planar gate structure in which a MOS gate is provided in a plate-like shape on the semiconductor substrate.

A structure of a conventional semiconductor device will be described. FIG. 17 is a cross-sectional view of the structure of the conventional semiconductor device. FIG. 17 is a cross-sectional view of the structure at cutting line AA-AA' in FIG. 18. FIG. 18 is a plan view of a layout when the conventional semiconductor device is viewed from a front surface side of a semiconductor substrate. In FIG. 18, a layout of an $n^+$-type source region 105, a $p^{++}$-type contact region 106, a trench 107, and a gate electrode 109 is depicted while a gate insulating film 108 is not depicted.

The conventional semiconductor device depicted in FIGS. 17 and 18 is a vertical metal oxide semiconductor field effect transistor (MOSFET) that includes an insulated gate having a 3-layer structure including a metal, an oxide film, and a semiconductor material and that has a MOS gate of a trench-gate structure in which, via the gate insulating film 108, the gate electrode 109 is embedded in the trench 107 formed in a semiconductor substrate 110.

In the MOSFET of a conventional trench-gate structure, during ON operation, while voltage that is positive with respect to a source electrode 112 is applied to a drain electrode 113, gate voltage that is at least equal to a gate threshold voltage Vth is applied to the gate electrode 109. As a result, an n-type inversion layer (channel) 104a is formed at a portion of a p-type base region 104, along a side wall of the trench 107 and sandwiched between the $n^+$-type source region 105 and an n-type current spreading region 103.

As a result of formation of the channel 104a, a main current (current between a drain and a source) Ids flows from the drain electrode 113, through an $n^-$-type drift region 102, the n-type current spreading region 103, the channel 104a, and the $n^+$-type source region 105 to the source electrode 112, and the MOSFET is in an ON state. In other words, the conventional trench-gate structure has a structure in which the $n^+$-type source region 105 and the channel 104a are in contact with each other.

The $p^{++}$-type contact region 106 is disposed at a position separated further from the trench 107 than is the $n^+$-type source region 105. The $p^{++}$-type contact region 106 is dispersed at a predetermined interval along a direction X which is parallel to a front surface of the semiconductor substrate 110 and along which the trench 107 extends in a striped shape. Between (mesa region 107a) adjacent trenches 107, at a surface region of the front surface of the semiconductor substrate 110, a portion other than the $p^{++}$-type contact region 106 is the $n^+$-type source region 105.

The n-type current spreading region 103 is a so-called current spreading layer (CSL) that reduces spreading resistance. Reference numeral 111 is an interlayer insulating film. Reference numeral 101 is an $n^+$-type drain region. Reference numerals 121 and 122 are $p^+$-type regions that suppress electric field applied to the gate insulating film 108 when the MOSFET is OFF. Reference numeral 123 is an n-type region for forming a region that reduces breakdown voltage near a center of the mesa region 107a to be lower than that near a bottom of the trench 107 and in which avalanche current easily flows.

As a conventional semiconductor device, a device has been proposed in which a $p^+$-type limiting layer is provided along a side wall of a trench in an $n^+$-type emitter region, whereby a portion having a high impurity concentration in the $n^+$-type emitter region is eliminated (for example, refer to Japanese Laid-Open Patent Publication No. 2006-120789). In Japanese Laid-Open Patent Publication No. 2006-120789, the portion having a high impurity concentration in the $n^+$-type emitter region is eliminated, whereby sheet resistance of the $n^+$-type emitter region is increased and short circuit capability is enhanced.

SUMMARY

According to an embodiment, a semiconductor device includes a semiconductor substrate containing a semiconductor material having a bandgap wider than that of silicon; a first semiconductor layer forming a back surface of the semiconductor substrate; a second semiconductor layer of the semiconductor substrate and being of a first conductivity type, the second semiconductor layer provided in contact with the first semiconductor layer and closer to a front surface side of the semiconductor substrate than is first semiconductor layer; a third semiconductor layer of a second conductivity type and forming a front surface of the semiconductor substrate, the third semiconductor layer being a portion of the semiconductor substrate excluding the first semiconductor layer and the second semiconductor layer; a first semiconductor region of the first conductivity type and selectively provided in the third semiconductor layer; a second semiconductor region of the first conductivity type and selectively provided in the third semiconductor layer, an impurity concentration of the second semiconductor region being lower than an impurity concentration of the first semiconductor region; a third semiconductor region of the second conductivity type, the third semiconductor region being a portion of the third semiconductor layer excluding the first semiconductor region and the second semiconductor region; a trench penetrating the third semiconductor layer from the front surface of the semiconductor substrate in a thickness direction and reaching the second semiconductor layer; a gate electrode provided in the trench via a gate insulating film; a first electrode provided at the front surface of the semiconductor substrate and electrically connected to the first semiconductor region and the third semiconductor region; and a second electrode provided at the back surface of the semiconductor substrate and electrically connected to the first semiconductor layer. The first semiconductor region is disposed separated from the gate insulating film. The second semiconductor region is provided between the first semiconductor region and an inversion layer of the first conductivity type formed, during ON operation, in a portion of the third semiconductor region opposing the gate electrode across the gate insulating film, the second semiconductor region being in contact with the first semiconductor region and the inversion layer.

In the embodiment, the second semiconductor region is disposed, positioned deeper toward the second electrode than is the front surface of the semiconductor substrate and shallower toward the first electrode than is the inversion layer, and reaches a position deeper toward the second electrode from the front surface of the semiconductor substrate than is the first semiconductor region.

In the embodiment, a thickness of the second semiconductor region is thinner than a thickness of the first semiconductor region.

In the embodiment, the second semiconductor region is in contact with an entire surface of the first semiconductor region facing toward the second electrode.

In the embodiment, the semiconductor device includes a fourth semiconductor region of the second conductivity type and selectively provided in the third semiconductor layer, the fourth semiconductor region being electrically connected to the first electrode and having an impurity concentration higher than that of the third semiconductor layer. The third semiconductor region is a portion of the third semiconductor layer excluding the first semiconductor region, the second semiconductor region, and the fourth semiconductor region. The first semiconductor region and the fourth semiconductor region are disposed to repeatedly alternate each other in a direction parallel to the front surface of the semiconductor substrate and along which the trench extends in a linear shape.

In the embodiment, the fourth semiconductor region is disposed between the first semiconductor region and the gate insulating film. The second semiconductor region reaches a position deeper toward the second electrode from the front surface of the semiconductor substrate than is the fourth semiconductor region, and is in contact with a surface of the fourth semiconductor region on a side of the fourth semiconductor region facing toward the second electrode, closer to the gate insulating film than is the first semiconductor region.

In the embodiment, the impurity concentration of the second semiconductor region is lower than an impurity concentration of the fourth semiconductor region.

In the embodiment, the fourth semiconductor region is a second-conductivity-type spreading region. The second semiconductor region has a first portion in contact with a surface of the fourth semiconductor region on a side of the fourth semiconductor region facing toward the second electrode, and a second portion separated further from the gate insulating film than is the first portion, a thickness of the first portion thinner than a thickness of the second portion.

In the embodiment, the thickness of the first portion of the second semiconductor region is in a range from 0.05 µm to 0.25 µm.

In the embodiment, the semiconductor device includes a first second-conductivity-type region selectively provided in the second semiconductor layer, the first second-conductivity-type region separated from the third semiconductor region and opposing a bottom of the trench in a thickness direction; a second second-conductivity-type region provided in the second semiconductor layer, the second second-conductivity-type region in contact with the third semiconductor region and separated from the trench and the first second-conductivity-type region; and a fifth semiconductor region of the first conductivity type selectively provided in the second semiconductor layer, the fifth semiconductor region provided closer to the second electrode than is the second second-conductivity-type region, and opposing the second second-conductivity-type region in the thickness direction.

In the embodiment, the semiconductor device includes a sixth semiconductor region in a surface layer of the second semiconductor layer on a side of the second semiconductor layer bordering the third semiconductor layer, the sixth semiconductor region being of the first conductivity type and having an impurity concentration higher than that of the second semiconductor layer. The bottom of the trench terminates in the sixth semiconductor region. The first second-conductivity-type region and the second second-conductivity-type region are selectively provided in the sixth semiconductor region.

In the embodiment, the impurity concentration of the second semiconductor region is in a range from $1\times10^{17}/cm^3$ to $1\times10^{19}/cm^3$.

In the embodiment, the impurity concentration of the second semiconductor region is in a range from $4\times10^{17}/cm^3$ to $3\times10^{18}/cm^3$.

In the embodiment, the impurity concentration of the first semiconductor region is in a range from $3\times10^{19}/cm^3$ to $3\times10^{20}/cm^3$.

Objects, features, and advantages of the present invention are specifically set forth in or will become apparent from the following detailed description of the invention when read in conjunction with the accompanying drawings.

DESCRIPTION OF EMBODIMENTS

Figure 17:
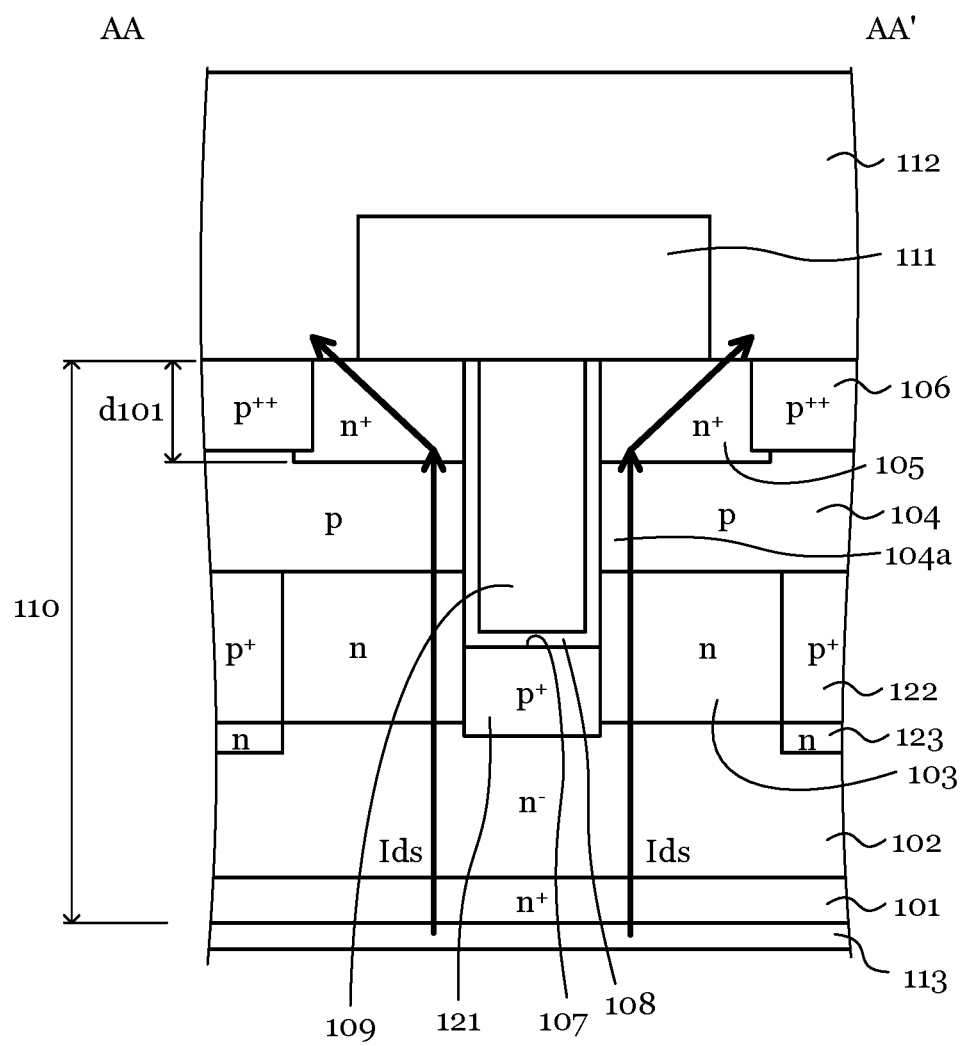
FIG. 17 is a cross-sectional view of a structure of a conventional semiconductor device.
Figure 18:
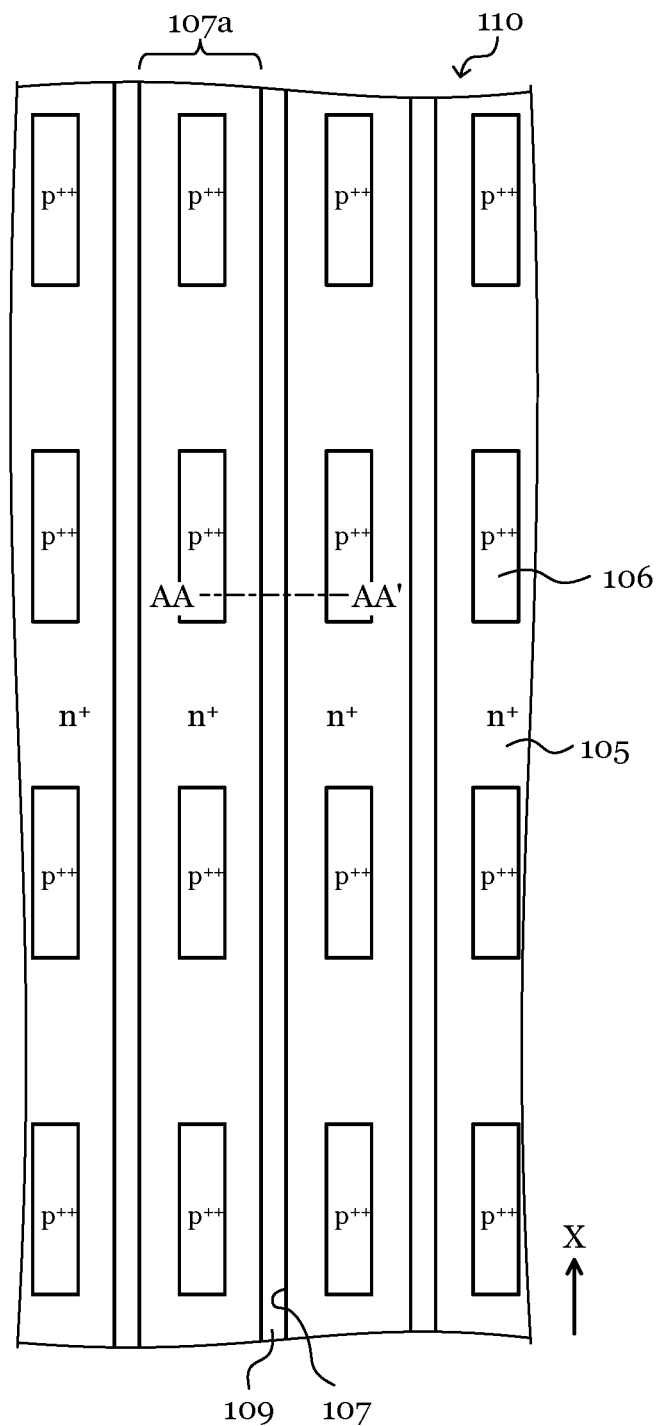
FIG. 18 is a plan view of a layout when the conventional semiconductor device is viewed from a front surface side of a semiconductor substrate.

First, problems associated with the conventional techniques will be discussed. In the conventional semiconductor device (refer to FIGS. 17 and 18, hereinafter, conventional example) described above, accompanying increases in voltage (voltage between a drain and a source) Vds that is positive with respect to the source electrode 112 and applied to the drain electrode 113, the current Ids between the drain and the source flowing from the drain electrode 113, through the channel 104a and to the source electrode 112 increases (refer to conventional example in FIG. 16 described hereinafter). Therefore, the greater is the reduction of the chip area and/or the ON resistance, the short circuit capability of a region (hereinafter, large-current region) 132 in which the current Ids between the drain and the source exceeds a rated current may decrease, leading to thermal destruction.

Figure 16:
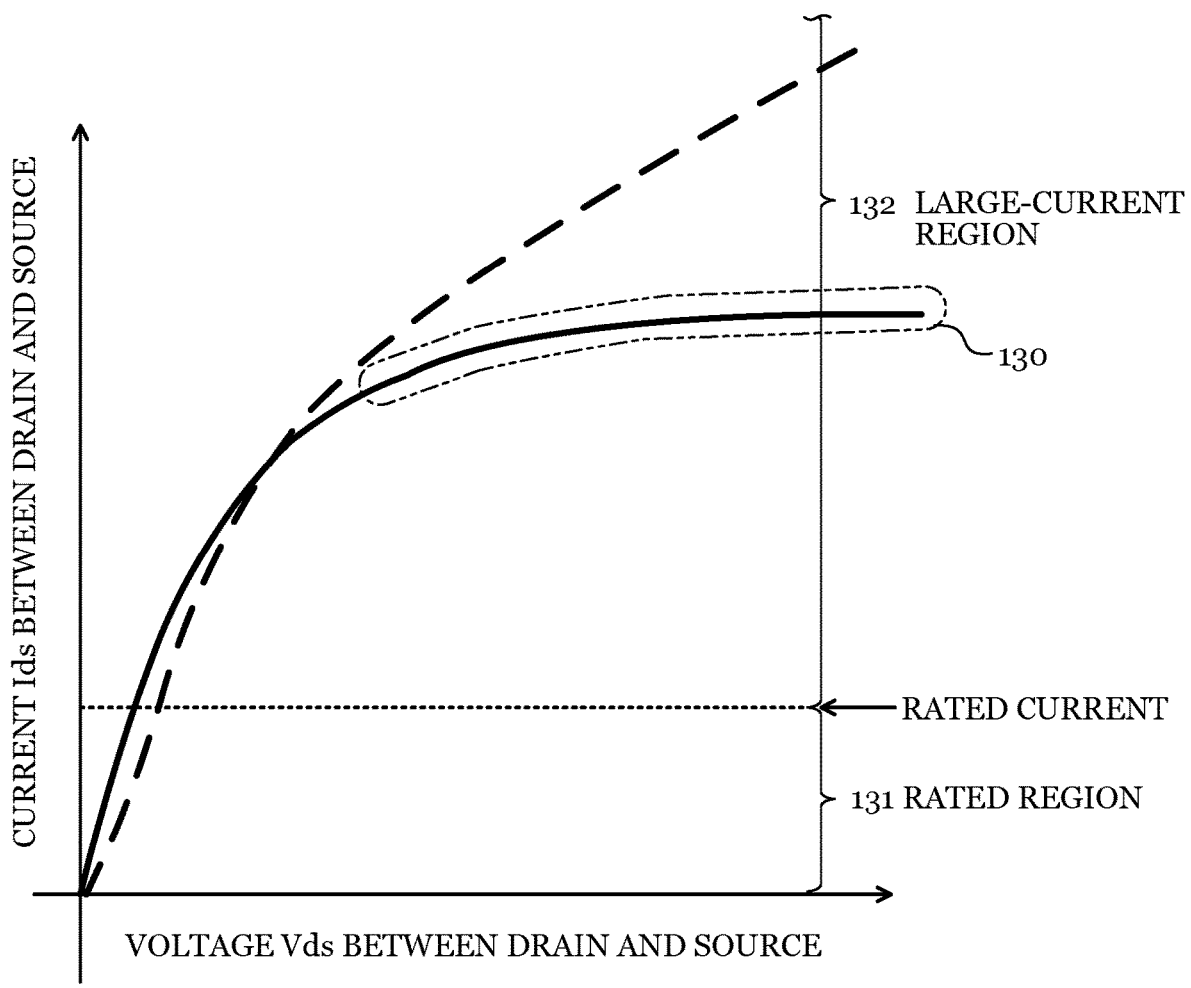
FIG. 16 is a characteristics diagram depicting an ideal curve of voltage-current characteristics of the semiconductor device according to the present invention.

To solve the problems above and achieve an object, the present invention has been made based on the following findings by the present inventor. FIG. 16 is a characteristics diagram depicting an ideal curve of voltage-current characteristics of the semiconductor device according to the present invention. As depicted in FIG. 16, it was found that giving the semiconductor device according to the present invention a structure in which the ON resistance is reduced in a region (hereinafter, rated region) 131 in which the current Ids between the drain and the source is equal to or less than the rated current and the ON resistance is increased in the large-current region 132, and reducing the current Ids between the drain and the source in the large-current region 132 during a short circuit is reduced (portion surrounded by frame indicated by reference numeral 130), generated heat of the semiconductor device is suppressed and short circuit capability may be increased. A reason for this is that power W that contributes to the generated heat of the semiconductor device is obtained by multiplying ON resistance R and a square of the current Ids between the drain and the source ($W=R \times (Ids)^2$).

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
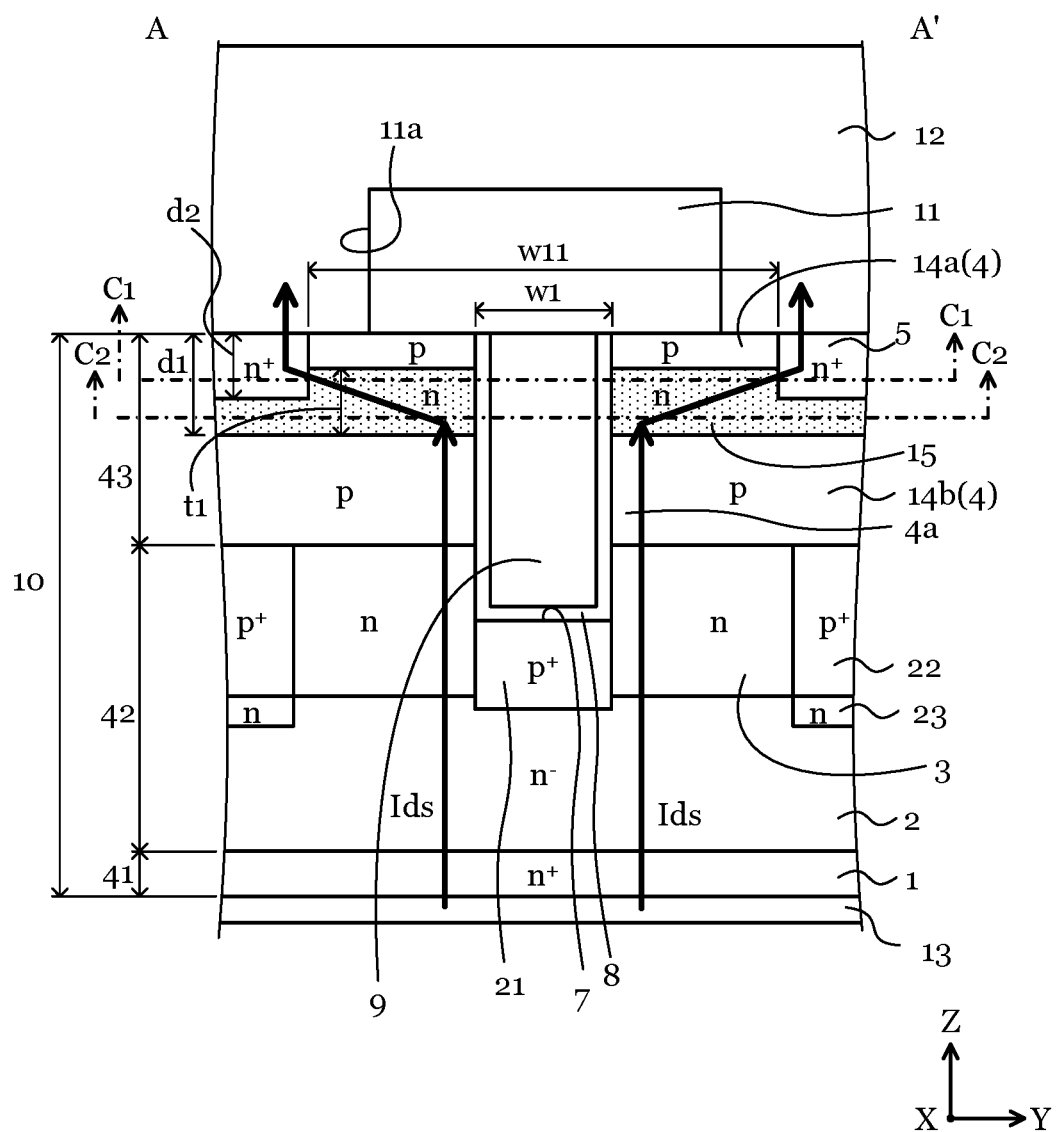
FIG. 1 is a cross-sectional view of a structure of a semiconductor device according to a first embodiment.
Figure 2:
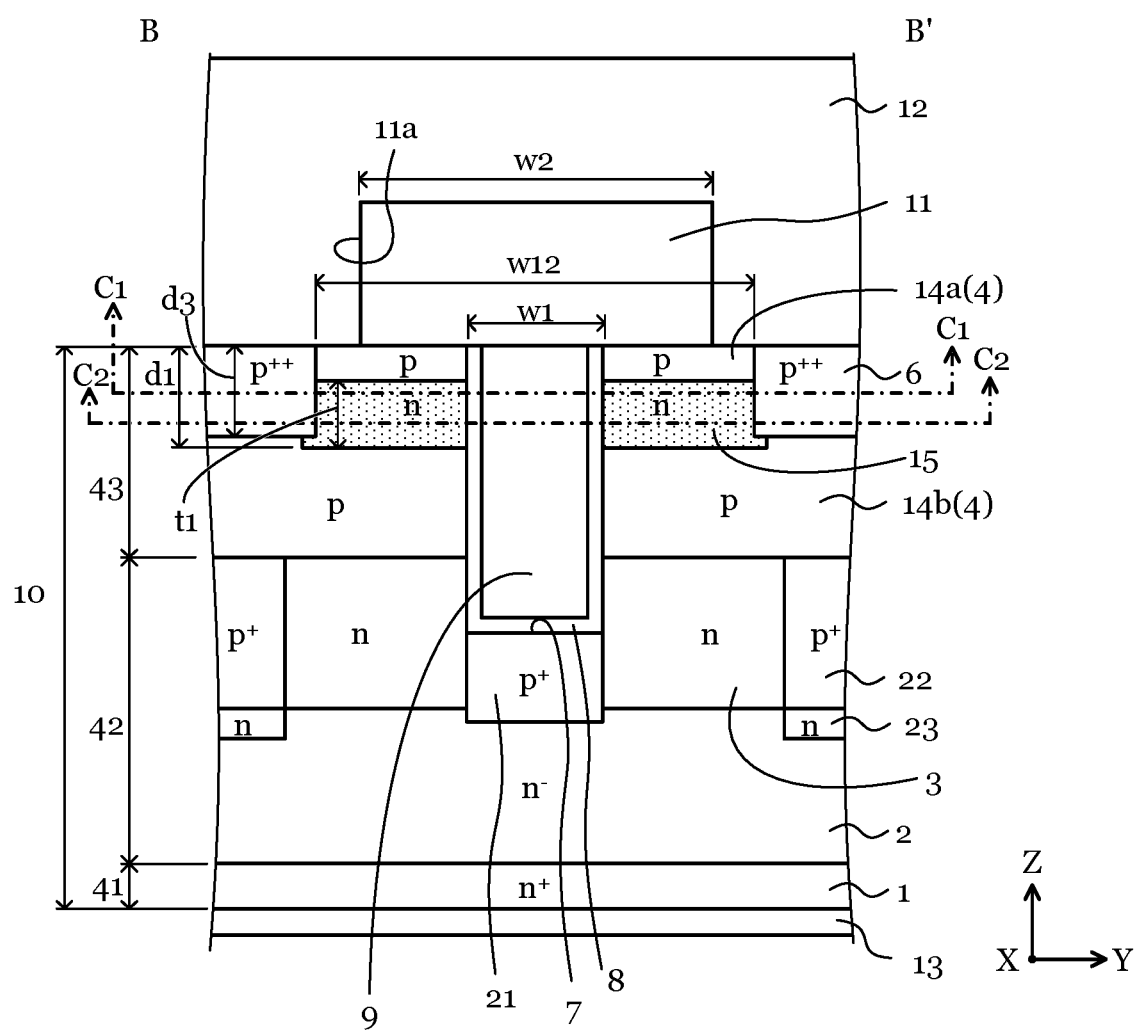
FIG. 2 is a cross-sectional view of the structure of the semiconductor device according to the first embodiment.
Figure 3:
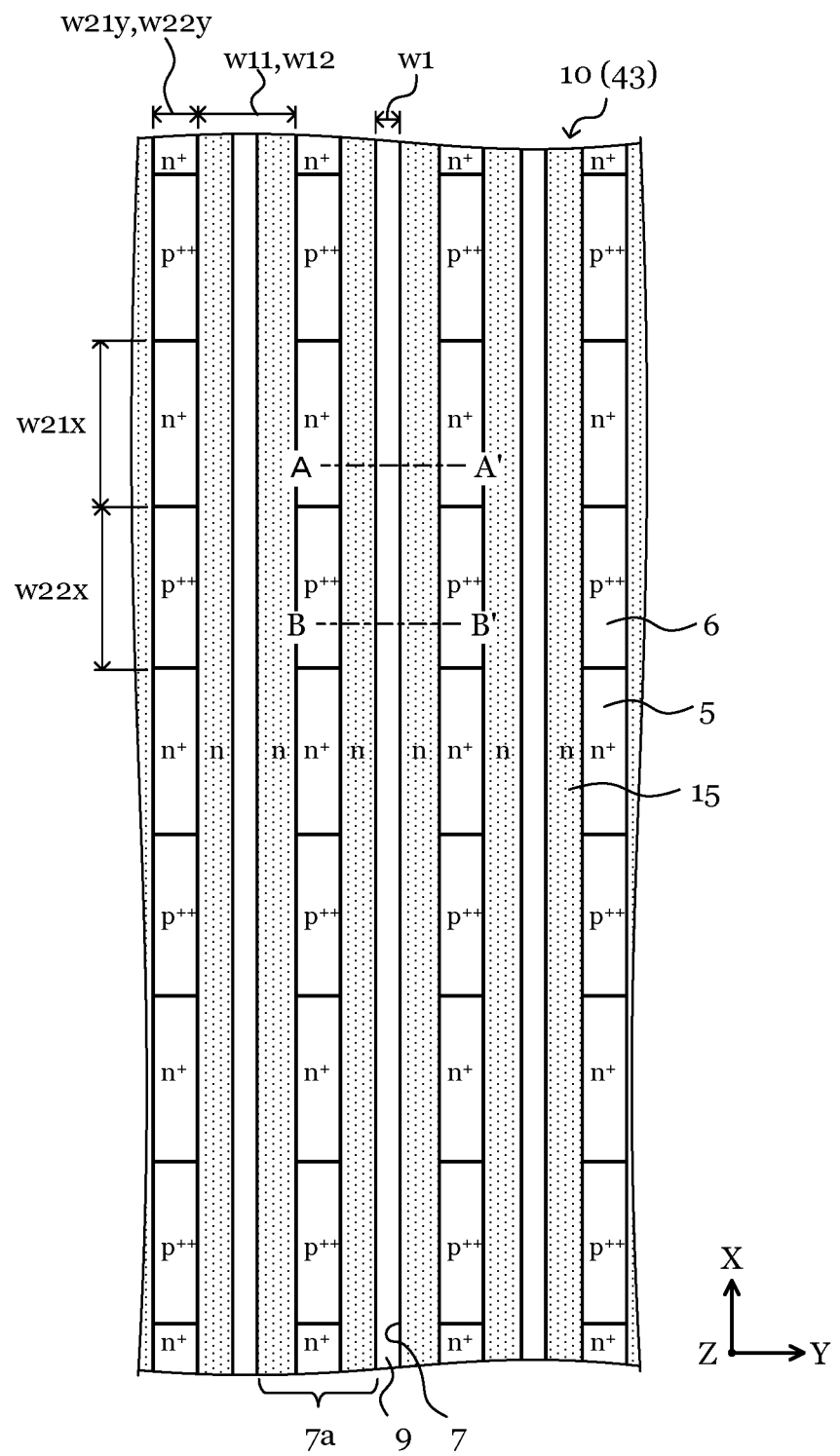
FIG. 3 is a plan view of a layout when the semiconductor device according to the first embodiment is viewed from a front surface side of a semiconductor substrate.
Figure 4:
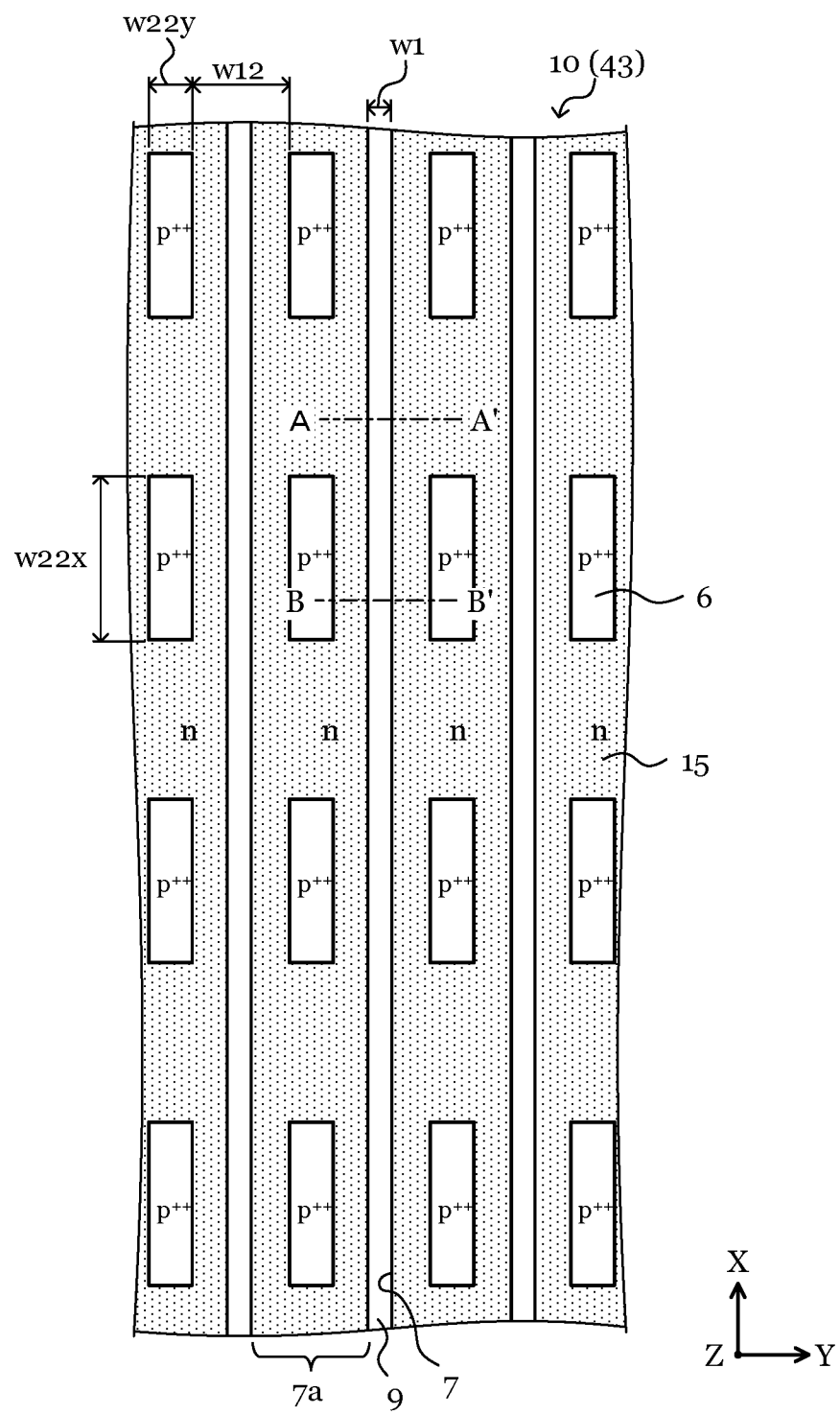
FIG. 4 is a plan view of a layout when the semiconductor device according to the first embodiment is viewed from the front surface side of the semiconductor substrate.

A structure of a semiconductor device according to a first embodiment will be described. FIGS. 1 and 2 are cross-sectional views of the structure of the semiconductor device according to the first embodiment. FIGS. 1 and 2 are cross-sectional views of the structure at cutting lines A-A', B-B' in FIGS. 3 and 4. FIGS. 3 and 4 are plan views of a layout when the semiconductor device according to the first embodiment is viewed from a front surface side of a semiconductor substrate. FIGS. 3 and 4 are plan views when a mesa region 7a is cut parallel to a front surface of a semiconductor substrate 10, along cutting lines C1-C1, C2-C2 in FIGS. 1 and 2, respectively, and depict a layout of an $n^+$-type source region 5, an n-type shunt resistance region (second semiconductor region) 15, and a $p^{++}$-type contact region 6 (fourth semiconductor region) at differing depths from the front surface of the semiconductor substrate 10. In FIGS. 3 and 4, gate insulating films 8 are not depicted.

The semiconductor device according to the first embodiment and depicted in FIGS. 1 to 4 is a vertical MOSFET including a MOS gate of trench-gate structure at a front surface side of the semiconductor substrate (semiconductor chip) 10 containing silicon carbide (SiC), and includes the n-type shunt resistance region 15. The n-type shunt resistance region 15 is a resistor for reducing a main current (current Ids between a drain and a source) in the large-current region 132 (refer to FIG. 16) during a short circuit. In FIG. 1, only an active region in which the main current flows when an element is in an ON state is depicted and an edge termination region surrounding a periphery of the active region is not depicted. The edge termination region has an edge termination structure that mitigates electric field toward the front surface of the semiconductor substrate 10 and sustains breakdown voltage (withstand voltage). The breakdown voltage is a voltage limit at which errant operation and destruction of an element do not occur.

The MOS gate is configured by a p-type base region (third semiconductor region) 4, the $n^+$-type source region (first semiconductor region) 5, the n-type shunt resistance region 15, the $p^{++}$-type contact region 6, a trench 7, the gate insulating film 8, and a gate electrode 9. In particular, the semiconductor substrate 10 is, for example, a silicon carbide epitaxial substrate in which silicon carbide layers (second and third semiconductor layers) 42, 43 forming an $n^-$-type drift region 2 and the p-type base region 4 are sequentially formed by epitaxial growth on a front surface of an $n^+$-type starting substrate (first semiconductor layer) 41 containing silicon carbide. The $n^+$-type starting substrate 41 configures an $n^+$-type drain region 1. The semiconductor substrate 10 has on opposite sides thereof, main surfaces including a front surface on a side having the p-type silicon carbide layer 43 and a rear surface back surface on a side having the $n^+$-type starting substrate 41 (back surface of the $n^+$-type starting substrate 41).

In the $n^-$-type silicon carbide layer 42, an n-type current spreading region (sixth semiconductor region) 3 is provided in contact with the p-type silicon carbide layer 43. The n-type current spreading region 3 is provided having a uniform thickness along a border between the $n^-$-type silicon carbide layer 42 and the p-type silicon carbide layer 43. The n-type current spreading region 3 is a so-called current spreading layer (CSL) that reduces spreading resistance. A portion of the $n^-$-type silicon carbide layer 42 excluding the n-type current spreading region 3 is the $n^-$-type drift region 2. In the n-type current spreading region 3, first and second $p^+$-type regions (first and second second-conductivity-type regions) 21, 22 are each selectively provided. The first and the second $p^+$-type regions 21, 22 form pn junctions with the n-type current spreading region 3 (or the $n^-$-type drift region 2) and thereby, have a function of suppressing electric field applied to the gate insulating film 8 when the MOSFET is OFF.

The first p+-type region 21 is provided separated from the p-type base region 4 and faces a bottom of the trench 7 in a thickness direction Z. The bottom of the trench 7 may terminate in the first p+-type region 21. Between (mesa region 7a) adjacent trenches 7, the second p+-type region 22 is provided in contact with the p-type base region 4 and separated from the first pt-type region 21 and the trench 7. The second p+-type region 22 may be provided at substantially a center of the mesa region 7a. The second p+-type region 22 may be partially connected to the first p+-type region 21. Directly beneath (toward the n+-type drain region 1) the second p+-type region 22, an n-type region 23 (fifth semiconductor region) is selectively provided in the n−-type drift region 2. The n-type region 23 has a function of making the breakdown voltage near the second p+-type region 22 lower than that near the first p+-type region 21.

In the p-type silicon carbide layer 43, the n+-type source region 5, the n-type shunt resistance region 15, and the p++-type contact region 6 are each selectively provided. A portion of the p-type silicon carbide layer 43 excluding the n+-type source region 5, the n-type shunt resistance region 15, and the p++-type contact region 6 is the p-type base region 4. In the mesa region 7a, the p-type base region 4, the n+-type source region 5, and the p++-type contact region 6 are each selectively exposed at the front surface of the semiconductor substrate 10. The n-type shunt resistance region 15 is provided between the n+-type source region 5 and a channel (n-type inversion layer) 4a formed in the p-type base region 4, along a side wall of the trench 7 during ON operation of the MOSFET, and is in contact with the n+-type source region 5 and the channel 4a.

Further, the n-type shunt resistance region 15 is disposed at a position deeper and closer to the drain (closer to a drain electrode (second electrode) 13) than is the front surface of the semiconductor substrate 10, and is not exposed at the front surface of the semiconductor substrate 10. Between the front surface of the semiconductor substrate 10 and the n-type shunt resistance region 15, a portion (hereinafter, first portion) 14a of the p-type base region 4 and the n+-type source region 5 are disposed. The n+-type source region 5 reaches the n-type shunt resistance region 15 from the front surface of the semiconductor substrate 10 in the thickness direction Z, and terminates in the n-type shunt resistance region 15. An entire surface of on a drain side of the n+-type source region 5 is in contact with the n-type shunt resistance region 15. The n+-type source region 5 and the p++-type contact region 6 are disposed at positions separated from the gate insulating film 8 of the side wall of the trench 7.

In the p-type base region 4, the first portion 14a closer to the source (closer to a source electrode (first electrode) 12) than is the n-type shunt resistance region 15 and a second portion 14b closer to the drain than is the n-type shunt resistance region 15 are electrically connected by the p++-type contact region 6. The n-type shunt resistance region 15 extends in a direction away from the side wall of the trench 7 to reach and terminate at the p++-type contact region 6, and be in contact with the p++-type contact region 6. Between the n-type current spreading region 3 and the n-type shunt resistance region 15 and between the n-type current spreading region 3 and the p++-type contact region 6, is the second portion 14b of the p-type base region 4. The p++-type contact region 6 may reach a position deeper from the front surface of the semiconductor substrate 10 toward the drain in the thickness direction Z than is the n+-type source region 5.

When the p++-type contact region 6 reaches a position deeper toward the drain than is the n-type shunt resistance region 15, for example, the n-type shunt resistance region 15 is disposed so as to divide the p-type base region 4 into the first portion 14a toward the source and the second portion 14b toward the drain. The p++-type contact region 6 penetrates the n-type shunt resistance region 15 from the front surface of the semiconductor substrate 10 in the thickness direction Z and reaches the second portion 14b of the p-type base region 4. At a position deeper from the front surface of the semiconductor substrate 10 than is the n+-type source region 5, the p++-type contact region 6, when viewed from the front surface side of the semiconductor substrate 10, is dispersed at the predetermined interval along the first direction X and a periphery thereof is surrounded by the n-type shunt resistance region 15 (refer to FIG. 4).

An impurity concentration of the n-type shunt resistance region 15 is at least equal to an impurity concentration of the n-type current spreading region 3 and is lower than an impurity concentration of the n+-type source region 5. Further, in the n-type shunt resistance region 15, the impurity concentration thereof is made as low as possible so that the main current flows during ON operation and a thickness t1 thereof is increased to increase resistance. The thickness t1 of the n-type shunt resistance region 15 is thinner than a depth (a thickness of the n+-type source region 5) d2 of the n+-type source region 5 from the front surface of the semiconductor substrate 10. Further, since the n-type shunt resistance region 15 may have high resistance advantageously, the lower is the impurity concentration of the n-type shunt resistance region 15 may be advantageous.

A depth d1 of the n-type shunt resistance region 15 from the front surface of the semiconductor substrate 10 may be about equal to a depth d101 (for example, about 0.55 μm) of the n+-type source region 105 in a conventional structure (refer to FIGS. 17 and 18) and a channel length may be about equal to that in the conventional structure. The channel length is a length in the thickness direction Z of a portion of the channel 4a along the side wall of the trench 7. Therefore, a resistance value of the n-type shunt resistance region 15 may be adjusted according to the impurity concentration of the n-type shunt resistance region 15.

In particular, the impurity concentration of the n-type shunt resistance region 15 may be, for example, in a range from about $1 \times 10^{17}/cm^3$ to $1 \times 10^{19}/cm^3$. Further, the impurity concentration of the n-type shunt resistance region 15 may be higher than an impurity concentration of the channel 4a. In particular, the impurity concentration of the n-type shunt resistance region 15 may be, for example, in a range from about $4 \times 10^{17}/cm^3$ to $3 \times 10^{18}/cm^3$. An impurity concentration of the n-type current spreading region 3 may be, for example, about $1 \times 10^{17}/cm^3$.

An impurity concentration of the n+-type source region 5 may be, for example, in a range from about $3 \times 10^{19}/cm^3$ to $3 \times 10^{20}/cm^3$. The depth d2 of the n+-type source region 5 from the front surface of the semiconductor substrate 10 may be, for example, about 0.15 μm. A depth (thickness of the p++-type contact region 6) d3 of the p++-type contact region 6 from the front surface of the semiconductor substrate 10 may be, for example, in a range from about 0.35 μm to 0.45 μm.

The trench 7, at a position separated from the n+-type source region 5 and the p++-type contact region 6, penetrates the p-type silicon carbide layer 43 in the thickness direction Z from the front surface of the semiconductor substrate 10 and reaches the n-type current spreading region 3. In other words, the trench 7 penetrates the first portion 14a of the p-type base region 4, the n-type shunt resistance region 15, and the second portion 14b of the p-type base region 4 from the front surface of the semiconductor substrate 10 and reaches the n-type current spreading region 3. The p-type base region 4 and the n-type shunt resistance region 15 are exposed at the side wall of the trench 7 and oppose the gate electrode 9 across the gate insulating film 8 at the side wall of the trench 7.

In particular, the trench 7, for example, extends in a striped shape along a direction (hereinafter, first direction) X parallel to the front surface of the semiconductor substrate 10. A width w1 of the trench 7 is, for example, about 0.7 µm. The $n^+$-type source region 5 and the $p^{++}$-type contact region 6 are disposed separated from the gate insulating film 8 at the side wall of the trench 7 in a direction (hereinafter, second direction) Y parallel to the front surface of the semiconductor substrate 10 and orthogonal to the first direction X, and are disposed at substantially the center of the mesa region 7a, repeatedly alternating each other in the first direction X. The first portion 14a of the p-type base region 4 and the n-type shunt resistance region 15 are disposed between the trench 7 and the $n^+$-type source region 5 and between the trench 7 and the $p^{++}$-type contact region 6, in a linear shape parallel to the first direction X (refer to FIG. 3).

A distance w11 between adjacent $n^+$-type source regions 5 sandwiching one of the trenches 7 may be, for example, about 2.4 µm. A distance w12 between adjacent $p^{++}$-type contact regions 6 sandwiching the one of the trenches 7 is, for example, equal to the distance w11 between the adjacent $n^+$-type source regions 5 sandwiching the one of the trenches 7. Widths w21x, w22x of the $n^+$-type source region 5 and the $p^{++}$-type contact region 6 in the first direction X may be, for example, in a range from about 1.0 µm to 6.5 µm. Widths w21y, w22y of the $n^+$-type source region 5 and the $p^{++}$-type contact region 6 in the second direction Y may be, for example, about 1.0 µm.

In the trench 7, the gate electrode 9 is provided via the gate insulating film 8. An interlayer insulating film 11 is provided on the front surface of the semiconductor substrate 10 so as to cover the gate electrode 9. A width w2 between contact holes 11a in the interlayer insulating film 11 may be, for example, about 1.8 µm. The source electrode 12 is in contact with the first portion 14a of the p-type base region 4, the $n^+$-type source region 5, and the $p^{++}$-type contact region 6 via the contact hole 11a and is electrically insulated from the gate electrode 9 by the interlayer insulating film 11. On the back surface of the semiconductor substrate 10, the drain electrode 13 is provided in contact with the $n^+$-type drain region 1.

In this manner, the $n^+$-type source region 5 and the n-type shunt resistance region 15 are disposed, whereby during ON operation of the semiconductor device according to the first embodiment described above, the n-type inversion layer (channel) 4a is formed at the portion of the p-type base region 4, along the side wall of the trench 7 and sandwiched between the n-type shunt resistance region 15 and the n-type current spreading region 3. In other words, in the semiconductor device according to the first embodiment described above, at the portion along the side wall of the trench 7, a structure is formed in which the n-type shunt resistance region 15 and the channel 4a are in contact with each other.

As described above, according to the first embodiment, in the p-type base region, the $n^+$-type source region is disposed separated from the trench, and the n-type shunt resistance region having an impurity concentration lower than that of the $n^+$-type source region is disposed between the $n^+$-type source region and the channel. As a result, while the main current that flows from the drain electrode, through the channel, the n-type shunt resistance region, and the $n^+$-type source region and toward the source electrode is equal to or less than the rated current, the ON resistance may be set by adding the resistance value that is due to the n-type shunt resistance region to the ON resistance for the rated current, only when a predetermined ON resistance is maintained and the current becomes large and exceeds the rated current. Therefore, during steady-state ON operation, the predetermined ON resistance may be maintained and during an abnormality when large current flows, the short circuit capability may be increased.

Figure 5:
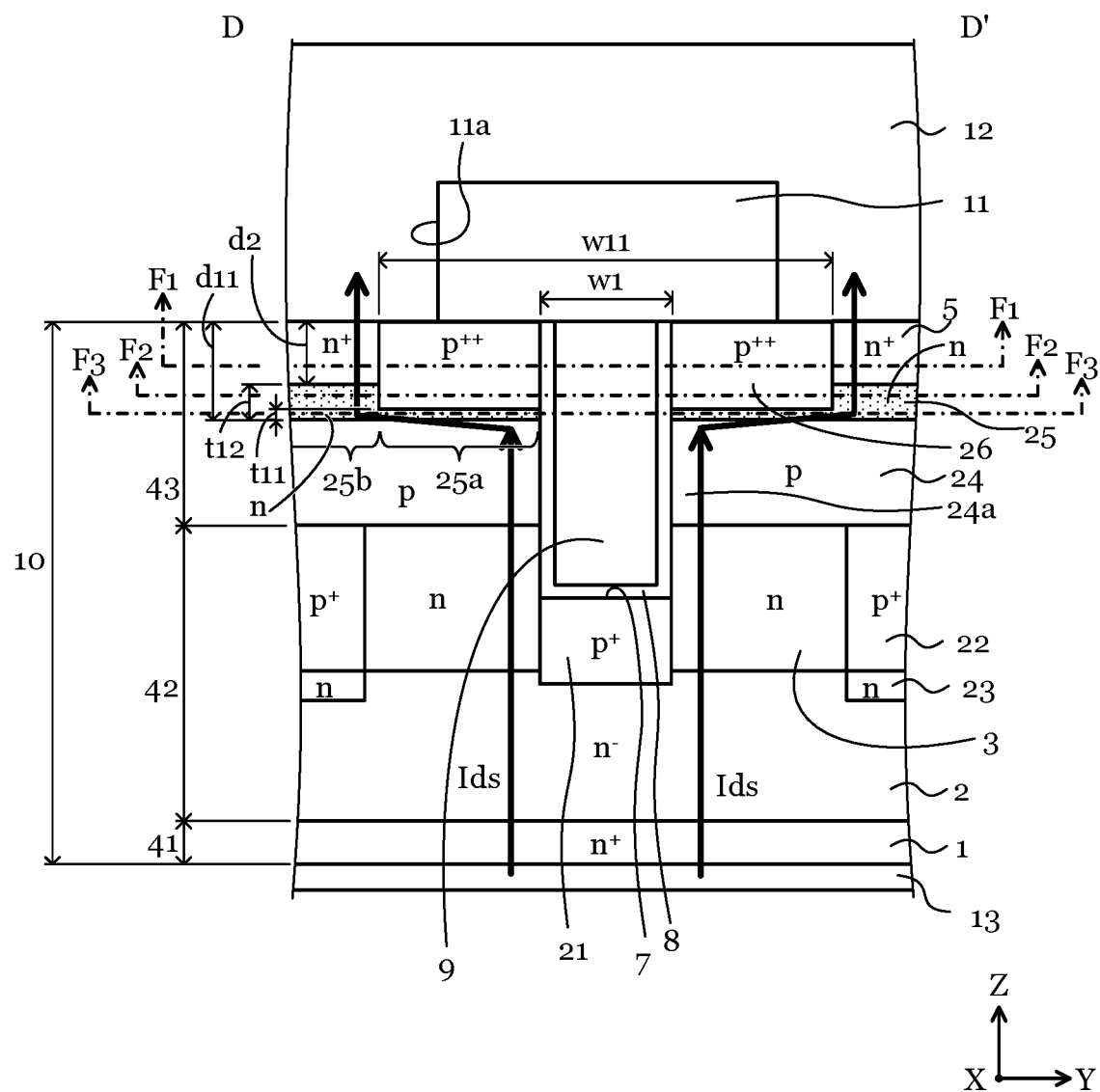
FIG. 5 is a cross-sectional view of the semiconductor device according to a second embodiment.
Figure 6:
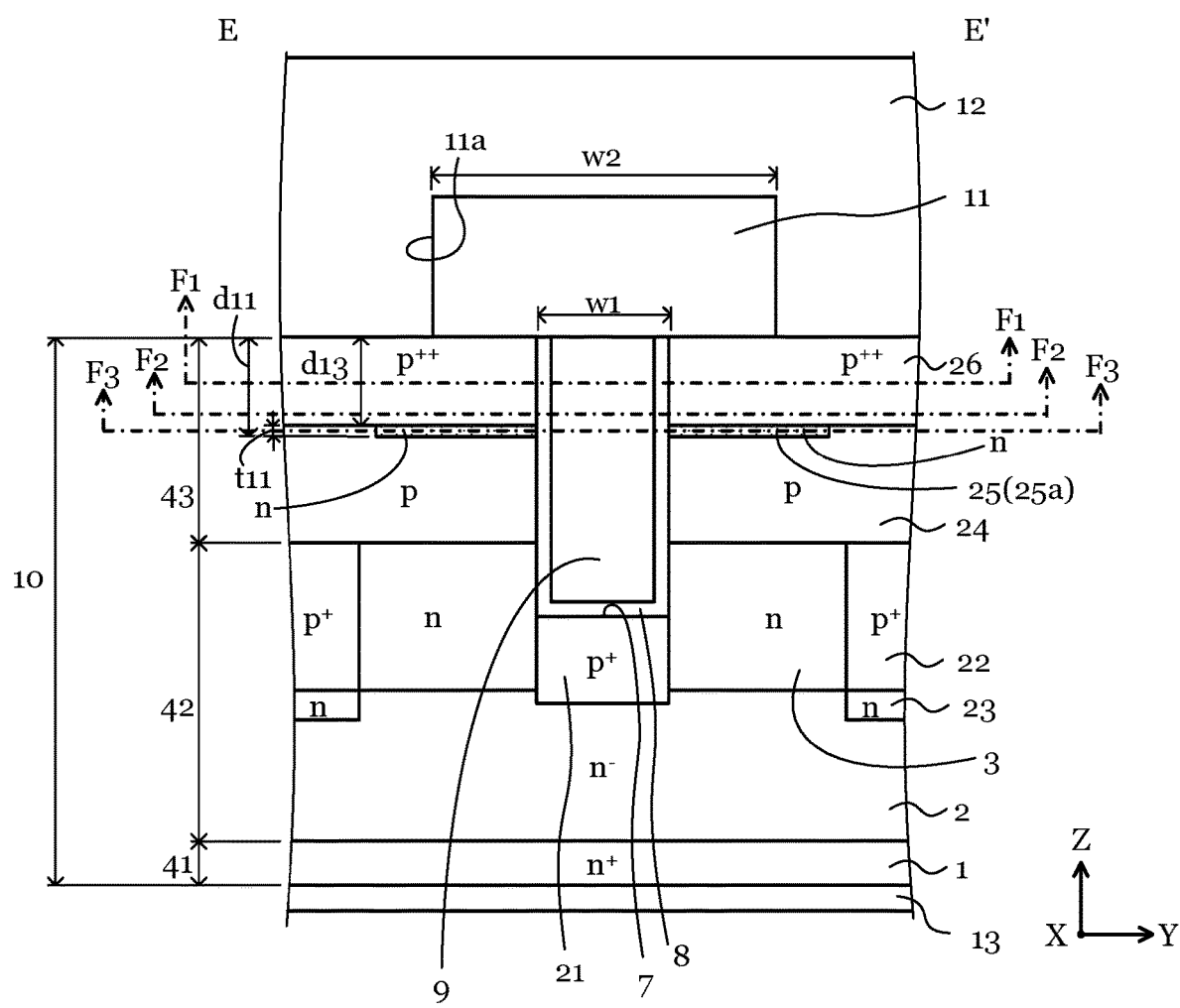
FIG. 6 is a cross-sectional view of the semiconductor device according to the second embodiment.
Figure 7:
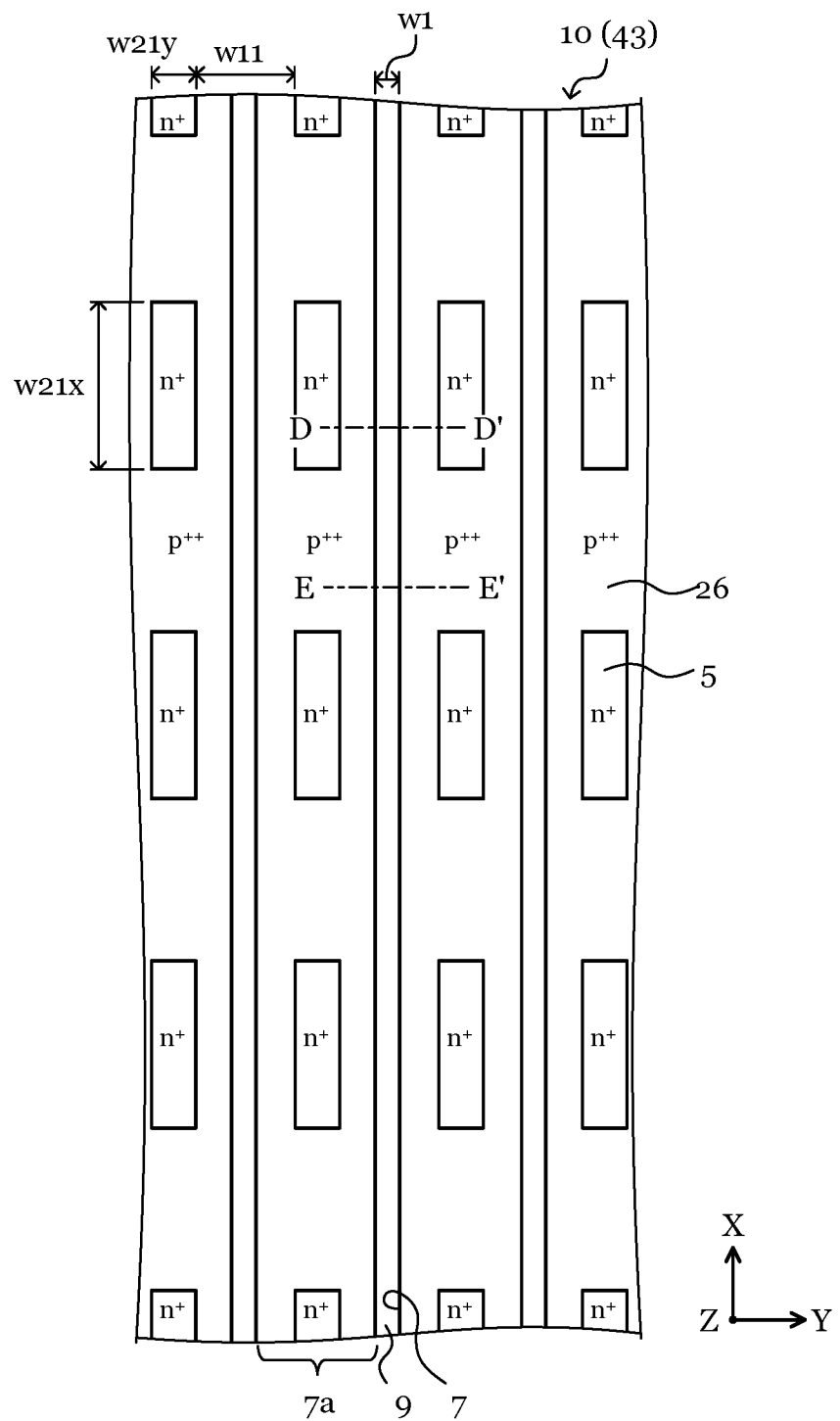
FIG. 7 is a plan view of a layout when the semiconductor device according to the second embodiment is viewed from the front surface side of the semiconductor substrate.
Figure 8:
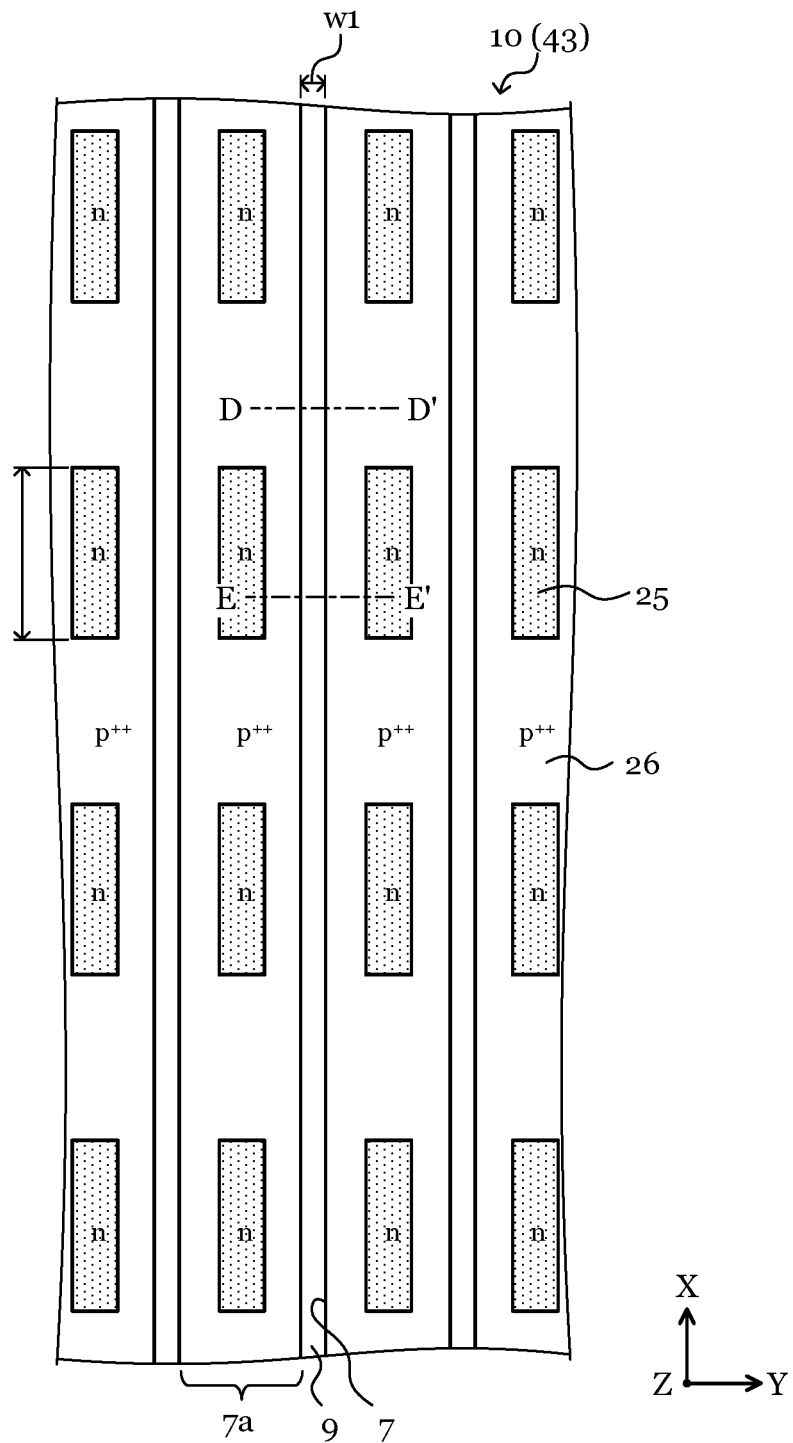
FIG. 8 is a plan view of a layout when the semiconductor device according to the second embodiment is viewed from the front surface side of the semiconductor substrate.
Figure 9:
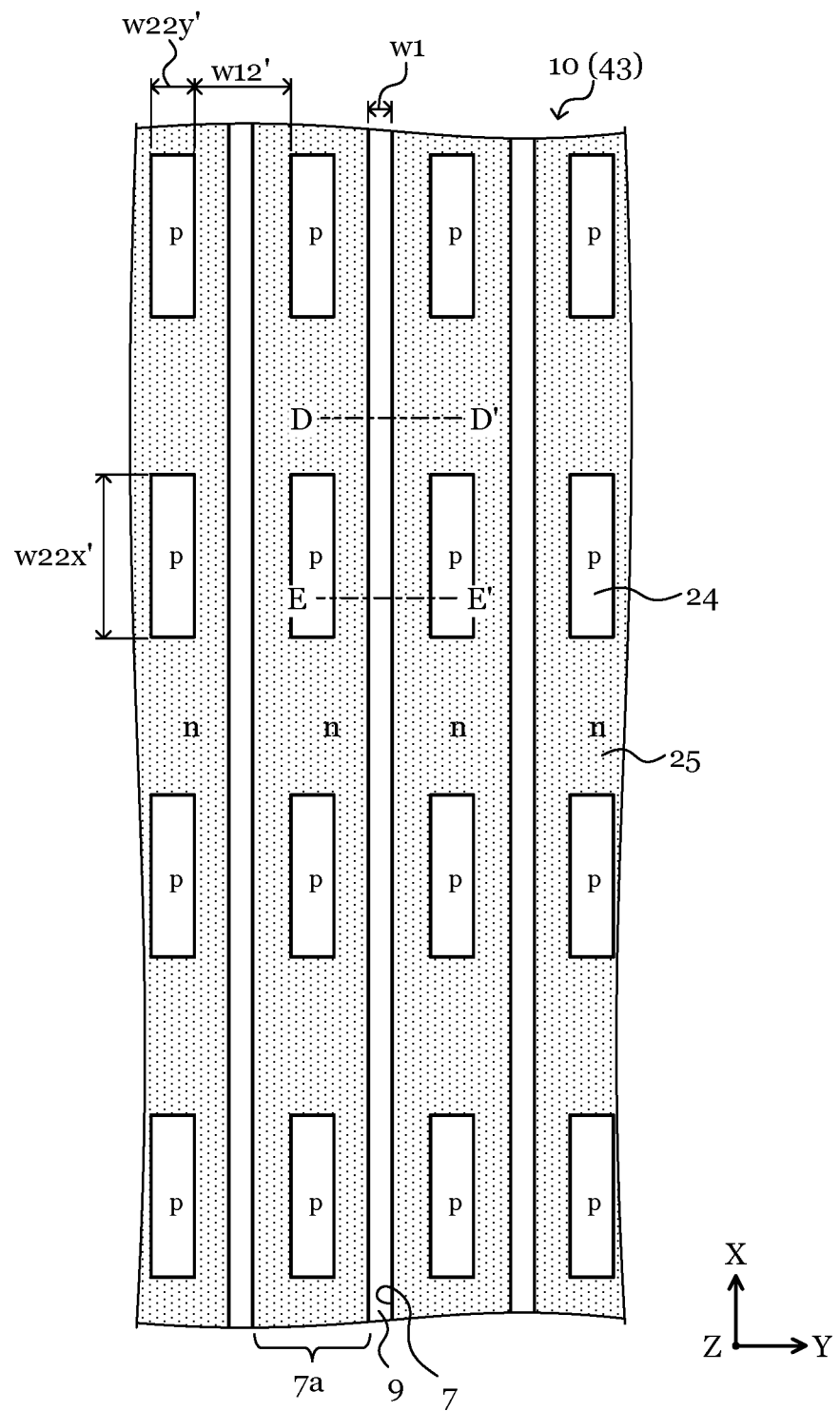
FIG. 9 is a plan view of a layout when the semiconductor device according to the second embodiment is viewed from the front surface side of the semiconductor substrate.

A structure of the semiconductor device according to a second embodiment will be described. FIGS. 5 and 6 are cross-sectional views of the semiconductor device according to the second embodiment. FIGS. 5 and 6 depict cross-sectional views of the structure along cutting lines D-D', E-E' in FIGS. 7 to 9. FIGS. 7, 8, and 9 are plan views of a layout when the semiconductor device according to the second embodiment is viewed from the front surface side of the semiconductor substrate. FIGS. 7 to 9 are plan views of the mesa region 7a along cutting lines F1-F1 to F3-F3 parallel to the front surface of the semiconductor substrate 10 in FIGS. 5 and 6, respectively. FIGS. 7 to 9 depict a layout of the $n^+$-type source region 5, an n-type shunt resistance region 25, and a $p^{++}$-type contact region 26 at differing depths from the front surface of the semiconductor substrate 10. In FIGS. 7 to 9, the gate insulating film 8 is not depicted.

The semiconductor device according to the second embodiment differs from the semiconductor device according to the first embodiment in that in the mesa region 7a, only the $n^+$-type source region 5 and the $p^{++}$-type contact region 26 are selectively exposed at the front surface of the semiconductor substrate 10. In particular, in a surface region of the front surface of the semiconductor substrate 10 in the mesa region 7a, the $n^+$-type source region 5 is dispersed at a predetermined interval along the first direction X and a periphery thereof is surrounded by the $p^{++}$-type contact region 26 (refer to FIG. 7).

In other words, the $p^{++}$-type contact region 26 is provided between $n^+$-type source regions 5 that are adjacent to each other in the first direction X and between the $n^+$-type source region 5 and the gate insulating film 8, and extends along the side wall of the trench 7 in the first direction X. The source electrode 12 is in contact with only the $n^+$-type source region 5 and the $p^{++}$-type contact region 26. A depth d13 of the $p^{++}$-type contact region 26 from the front surface of the semiconductor substrate 10 may be deeper from the front surface of the semiconductor substrate 10 than is the depth d2 of the $n^+$-type source region 5.

The n-type shunt resistance region 25 is disposed in the mesa region 7a, at a position deeper and closer to the drain than are the $n^+$-type source region 5 and the $p^{++}$-type contact region 26. The n-type shunt resistance region 25, similarly to the first embodiment, is disposed between a channel 24a and the $n^+$-type source region 5, and the $n^+$-type source region 5 and the channel 24a are in contact with each other. The n-type shunt resistance region 25, at a portion separated from the gate insulating film 8 and similarly to the first embodiment, is in contact with the entire surface on the drain side of the $n^+$-type source region 5.

The n-type shunt resistance region 25, at a portion (hereinafter, first portion) 25a closer to the gate insulating film 8 than is the $n^+$-type source region 5, is in contact with a surface on a drain side of the $p^{++}$-type contact region 26. In the n-type shunt resistance region 25, the first portion 25a toward the gate insulating film 8 is inverted to a p-type by ion implantation of a p-type impurity for forming the $p^{++}$-type contact region 26, and a thickness t11 is thinner than a thickness t12 of a portion (hereinafter, second portion) 25b separated from the gate insulating film 8.

For example, in selectively forming the n-type shunt resistance region 25 and the $p^{++}$-type contact region 26 in the p-type silicon carbide layer 43 by ion implantation, an impurity concentration of the n-type shunt resistance region 25 is made lower than an impurity concentration of the $p^{++}$-type contact region 26. In addition, a depth d11 of the n-type shunt resistance region 25 from the front surface of the semiconductor substrate 10 is deeper than the depth d13 of the $p^{++}$-type contact region 26 from the front surface of the semiconductor substrate 10.

Furthermore, for example, acceleration energy in the ion implantation of a p-type impurity such as aluminum (Al) for forming the $p^{++}$-type contact region 26, for example, suffices to be lower than acceleration energy in an ion implantation of an n-type impurity such as phosphorus (P) for forming the n-type shunt resistance region 25 such that the first portion 25a of the n-type shunt resistance region 25 is left having the predetermined thickness t11. As a result, with good controllability, the first portion 25a of the n-type shunt resistance region 25 may be left to have the predetermined thickness t11.

The thickness t11 the first portion 25a of the n-type shunt resistance region 25 may be, for example, in a range from about 0.05 μm to 0.25 μm. In the n-type shunt resistance region 25, the second portion 25b separated from the gate insulating film 8 is a portion of the n-type shunt resistance region 25 in contact with a surface of at a drain side of the $n^+$-type source region 5. The depths d11, d2, and d13 of the n-type shunt resistance region 25, the $n^+$-type source region 5, and the $p^{++}$-type contact region 26 from the front surface of the semiconductor substrate 10 are about equal to those in the first embodiment (d11=d1, d13=d3).

A portion of the p-type silicon carbide layer 43 closer to the drain than are the $n^+$-type source region 5, the n-type shunt resistance region 25, and the $p^{++}$-type contact region 26 is a p-type base region 24, and the p-type base region 24 is not exposed at the front surface of the semiconductor substrate 10. Between the $n^+$-type source regions 5 adjacent to each other in the first direction X, the p-type base region 24 is in contact with the $p^{++}$-type contact region 26. In other words, a portion of the p-type base region 24 in contact with the $p^{++}$-type contact region 26 is disposed dispersed in the first direction X as viewed from the front surface of the semiconductor substrate 10 and a periphery thereof is surrounded by the n-type shunt resistance region 25 (refer to FIG. 9).

Widths w22x', w22y' in the first and the second directions of a portion of the p-type base region 24 in contact with the $p^{++}$-type contact region 26, for example, are respectively equal to the widths w22x, w22y (refer to FIG. 4) in the first and the second directions of the $p^{++}$-type contact region 6 in the first embodiment. A distance w12' between portions of adjacent p-type base regions 24 sandwiching one trench and in contact with the $p^{++}$-type contact regions 26 is, for example, a same as the distance w12 between adjacent $p^{++}$-type contact regions 6 sandwiching one of the trenches 7 (refer to FIG. 4).

Figure 10:
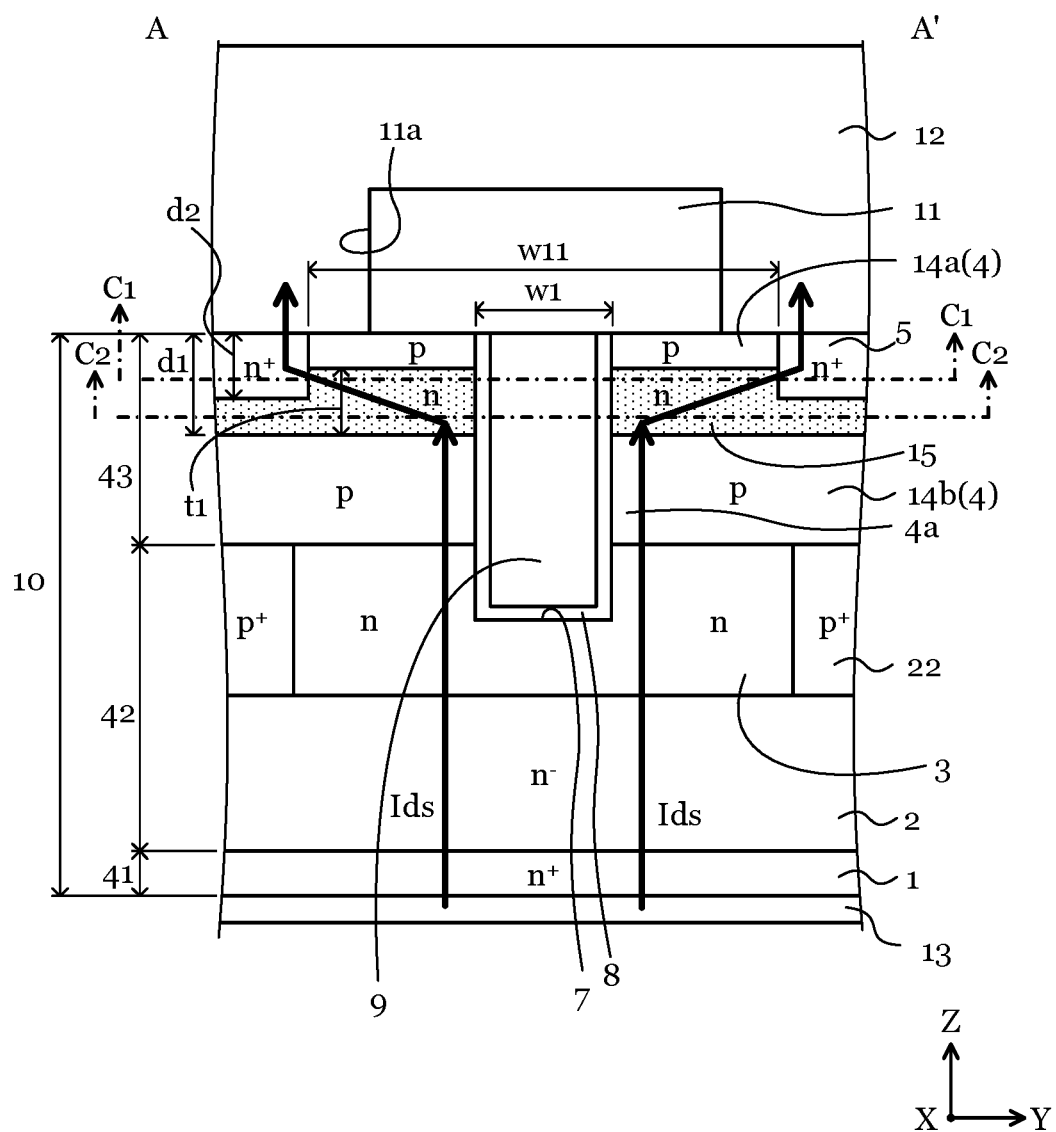
FIG. 10 is a cross-sectional view of the structure of the semiconductor device according to a third embodiment.
Figure 11:
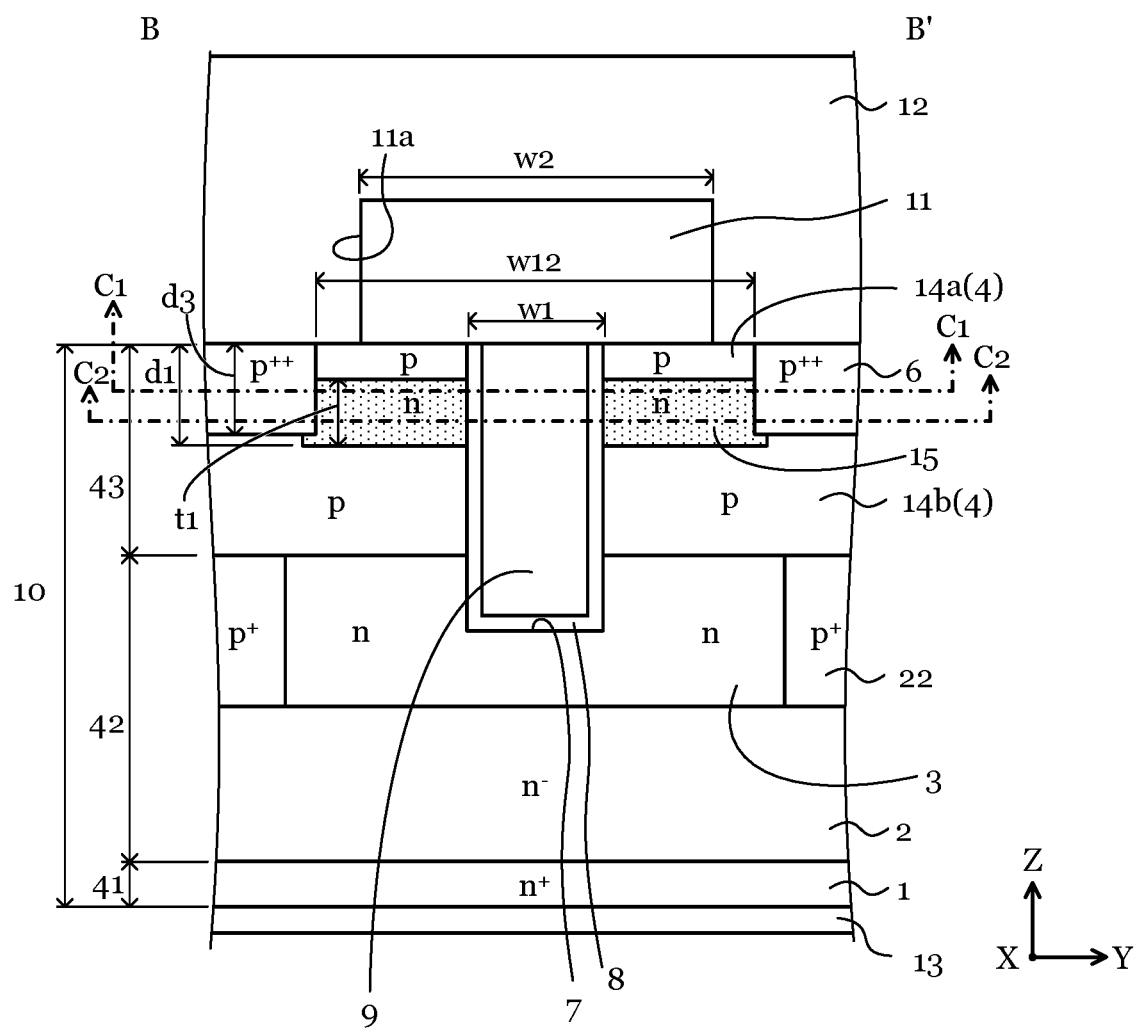
FIG. 11 is a cross-sectional view of the structure of the semiconductor device according to the third embodiment.

A structure of the semiconductor device according to a third embodiment will be described. FIGS. 10 and 11 are cross-sectional views of the structure of the semiconductor device according to the third embodiment. A plan view of a layout when the semiconductor device according to the third embodiment is viewed the front surface side of the semiconductor substrate 10 is a same as those depicted in FIGS. 3 and 4 and therefore, hereinafter, description will be given using FIGS. 3 and 4. FIGS. 10 and 11 are cross-sectional views of the structure at cutting lines A-A', B-B' in FIGS. 3 and 4.

The semiconductor device according to the third embodiment differs from the semiconductor device according to the first embodiment in that the first $p^+$-type region 21 opposing the bottom of the trench 7 in the thickness direction Z is omitted. When the distance w11 between adjacent $n^+$-type source regions 5 sandwiching one of the trenches 7 is thinner than in the first embodiment (refer to FIG. 1), the first $p^+$-type region 21 may be omitted. Furthermore, when the first $p^+$-type region 21 is omitted, the n-type region 23 (fifth semiconductor region) having a function of making the breakdown voltage near the second $p^+$-type region 22 lower than that near the first $p^+$-type region 21 may also be omitted. Other configurations of the semiconductor device according to the third embodiment are similar to those of the first embodiment and therefore, description thereof is omitted hereinafter.

Figure 12:
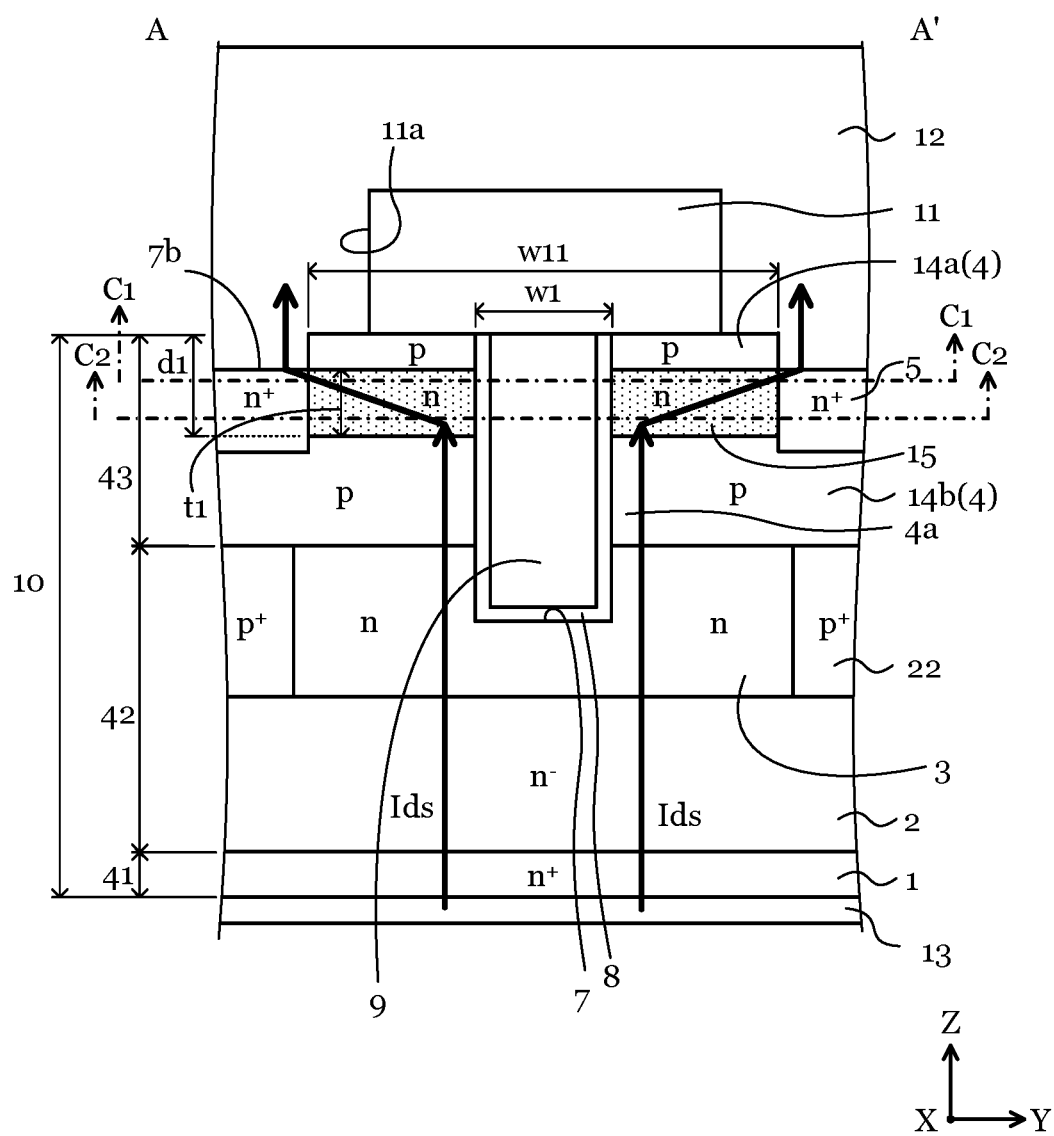
FIG. 12 is a cross-sectional view of the structure of the semiconductor device according to a fourth embodiment.
Figure 13:
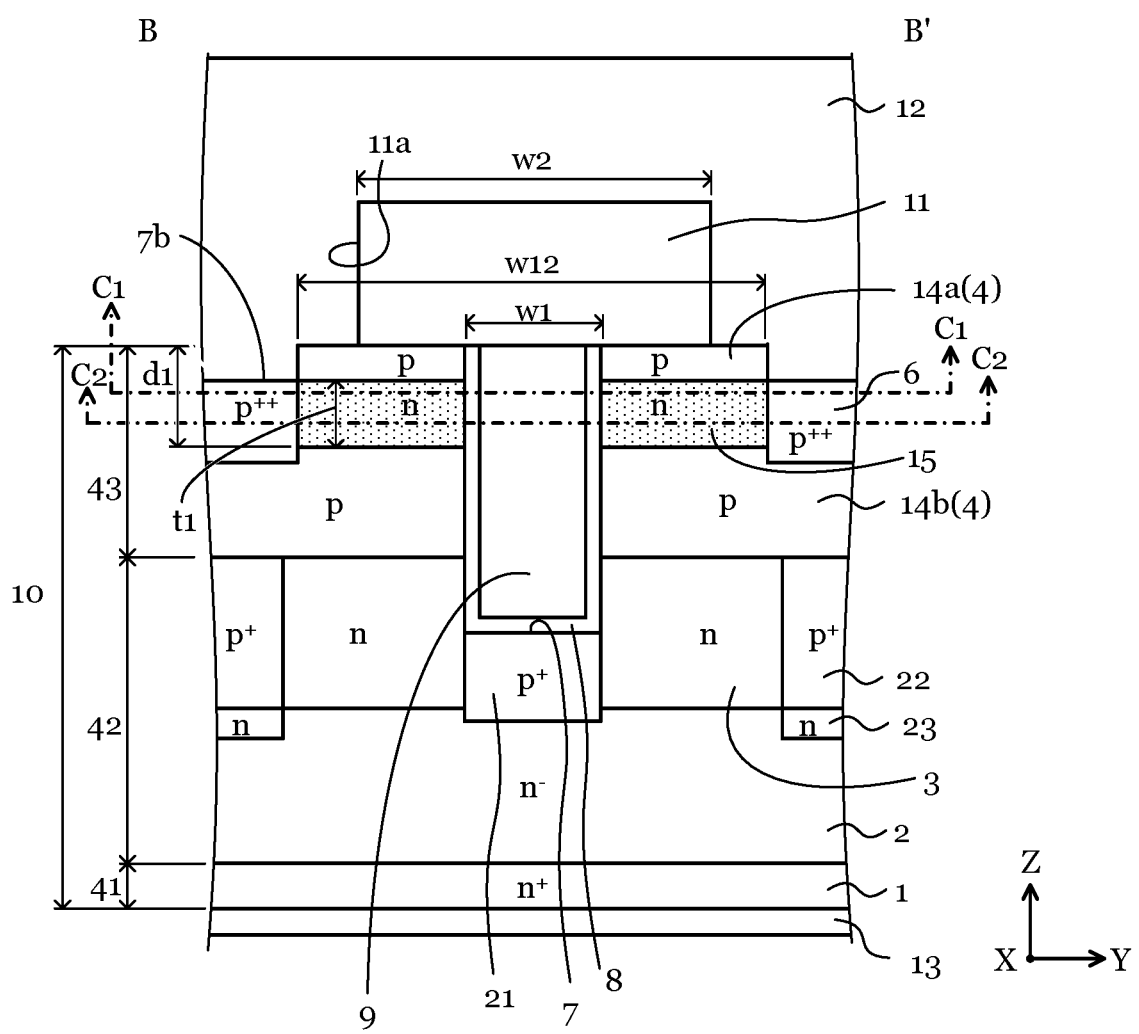
FIG. 13 is a cross-sectional view of the structure of the semiconductor device according to the fourth embodiment.

A structure of the semiconductor device according to a fourth embodiment will be described. FIGS. 12 and 13 are cross-sectional views of the structure of the semiconductor device according to the fourth embodiment. A plan view of a layout when the semiconductor device according to the fourth embodiment is viewed from the front surface side of the semiconductor substrate 10 is a same as those in FIGS. 3 and 4 and therefore, hereinafter, description will be given using FIGS. 3 and 4. FIGS. 12 and 13 are cross-sectional views of the structure at cutting lines A-A', B-B' in FIGS. 3 and 4.

The semiconductor device according to the fourth embodiment differs from the semiconductor device according to the third embodiment in that between adjacent trenches 7, a trench 7b shallower than the adjacent trenches 7 is provided, and the $n^+$-type source region 5 and the $p^{++}$-type contact region 6 are provided at a bottom of the trench 7b in the thickness direction Z. The $n^+$-type source region 5 and the $p^{++}$-type contact region 6 have a shape that drops below the first portion 14a of the p-type base region 4 in the thickness direction Z by an amount equal to a depth of the trench 7b, and configure a so-called contact trench. In the fourth embodiment, similarly to the first embodiment, the first $p^+$-type region 21 and the n-type region 23 (fifth semiconductor region) may be provided.

Figure 14:
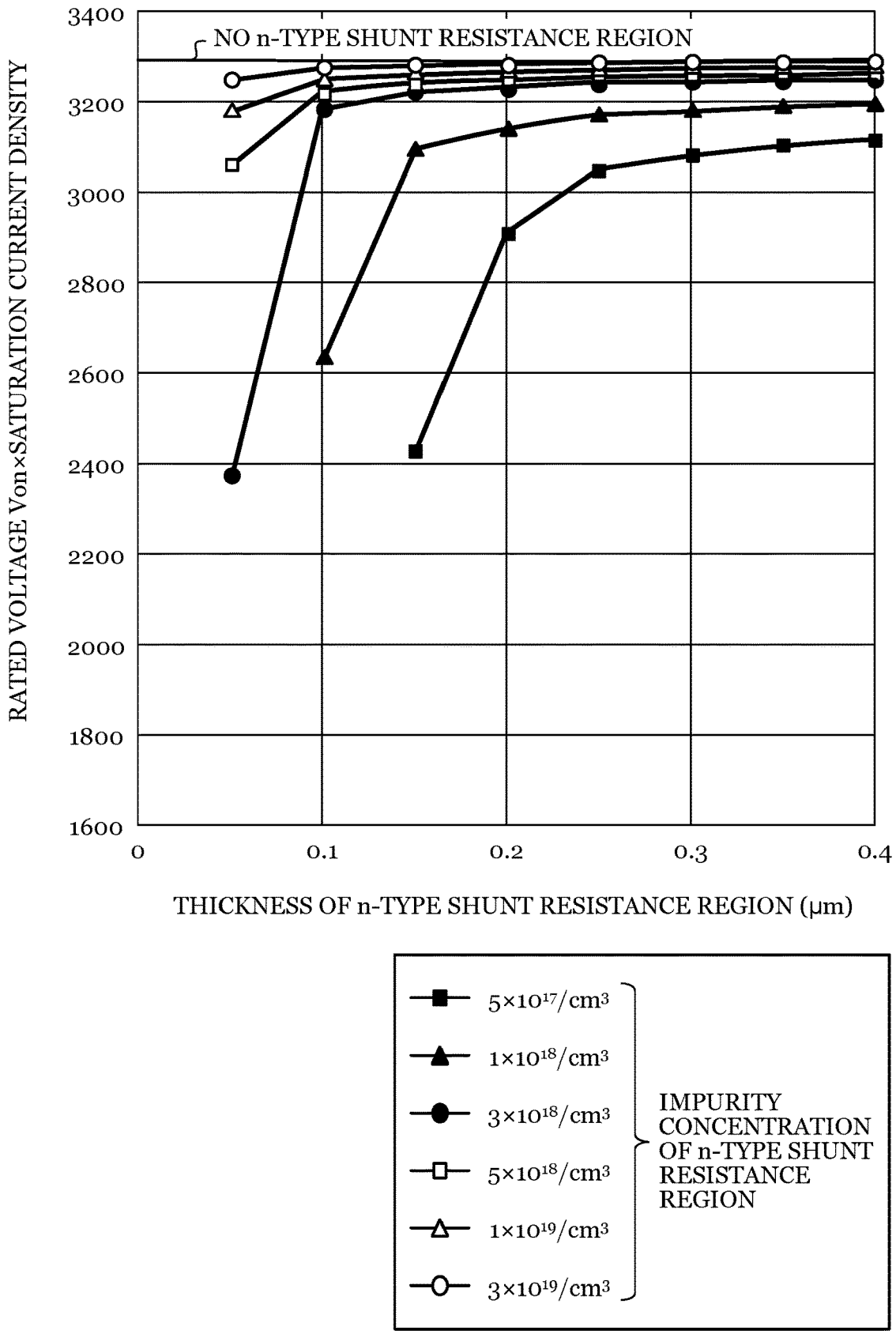
FIG. 14 is a characteristics diagram depicting results of simulation of a relationship between a thickness of an n-type shunt resistance region in an example and rated voltage Von and saturation current density.
Figure 15:
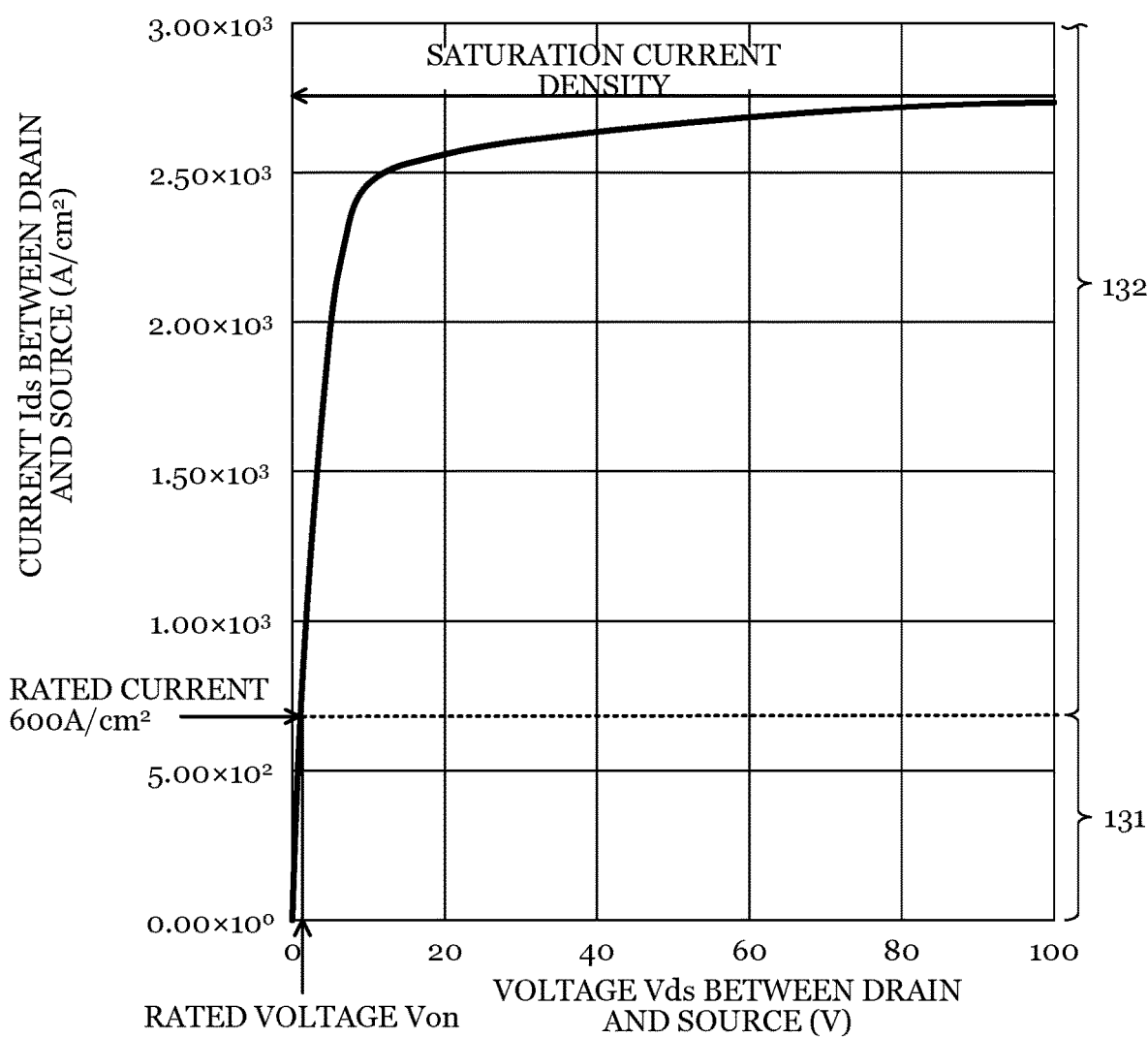
FIG. 15 is a diagram for explaining a definition of rated voltage and saturation current density.

Verification regarding the impurity concentration of the n-type shunt resistance region 25 and the thickness t11 of the first portion 25a of the n-type shunt resistance region 25 was performed. FIG. 14 is a characteristics diagram depicting results of simulation of a relationship between a thickness of an n-type shunt resistance region in an example and rated voltage Von and saturation current density. In FIG. 14, a horizontal axis is the thickness t11 of the first portion 25a of the n-type shunt resistance region 25 and a vertical axis is a value obtained by multiplying the rated voltage Von and saturation current density (=rated voltage Von×saturation current density). FIG. 15 is a diagram for explaining a definition of the rated voltage and saturation current density. In FIG. 15, an ideal curve of voltage-current characteristics in FIG. 16 is depicted.

Results of simulation of the rated voltage Von and the saturation current density when the impurity concentration of the n-type shunt resistance region 25 and the thickness t11 of the first portion 25a of the n-type shunt resistance region 25 are variously changed in a MOSFET (refer to FIGS. 5 to 9: hereinafter, example) including the structure of the semiconductor device according to the second embodiment described above are depicted in FIG. 14. In the example, the impurity concentration of the n-type shunt resistance region 25 was variously changed in a range between $5\times10^{17}/cm^3$ and $3\times10^{19}/cm^3$. The thickness t11 of the first portion 25a of the n-type shunt resistance region 25 was variously changed in a range between 0.05 μm and 0.4 μm.

Further, in FIG. 14, results of simulation of the rated voltage Von and saturation current density in the conventional structure (refer to FIGS. 17 and 18: hereinafter, the conventional example) are depicted. Conditions of the conventional example other than not having the n-type shunt resistance region were the same as those of the example. The rated voltage Von is voltage that is positive (voltage between a drain and a source) Vds with respect to the source electrode 12 and applied to the drain electrode 13, when the current Ids between the drain and the source reaches the rated current during ON operation. The rated current is, for example, 600 A/cm². The saturation current density is the current Ids between the drain and the source saturated by the large-current region 132 (FIG. 15).

Low values of the rated voltage Von and of the saturation current density are advantageous. Therefore, smaller values of "rated voltage Von×saturation current density" indicated on the vertical axis in FIG. 14 are advantageous. Accordingly, from the results depicted in FIG. 14, it was confirmed that the impurity concentration of the n-type shunt resistance region 25 may be about $3\times10^{18}/cm^3$ or less. When the impurity concentration of the n-type shunt resistance region 25 exceeds $3\times10^{18}/cm^3$, it was confirmed that "rated voltage Von×saturation current density" becomes about equal to that in the conventional example.

Further, from the results depicted in FIG. 14, the thickness t11 of the first portion 25a of the n-type shunt resistance region 25 may be 0.25 μm or less. In a sample in which the impurity concentration of the n-type shunt resistance region 25 was set to a lowest concentration of $5\times10^{17}/cm^3$, it was confirmed that when the thickness t11 of the first portion 25a of the n-type shunt resistance region 25 was 0.25 μm or less, "rated voltage Von×saturation current density" decreased.

Further, when the thickness t11 of the first portion 25a of the n-type shunt resistance region 25 was 0.05 μm, control of the thickness t11 by ion implantation became difficult. Therefore, the thickness t11 of the first portion 25a of the n-type shunt resistance region 25 may be 0.05 μm or more.

As described above, according to the second embodiment, effects similar to those of the first embodiment may be obtained. Further, according to the second embodiment, for example, the thickness of the first portion in contact with the surface on the drain side of the $p^{++}$-type contact region may be determined by adjusting the acceleration energy of the ion implantation of an n-type impurity such as phosphorus (P) for forming the n-type shunt resistance region. Further, for example, while controllability of the ion implantation of phosphorus for forming the n-type shunt resistance region is poor, according to the second embodiment, the thickness of the first portion of the n-type shunt resistance region, in contact with the surface on the drain side of the $p^{++}$-type contact region may be determined by the acceleration energy of the ion implantation of an n-type impurity such as phosphorous for forming the n-type shunt resistance region and, for example, by the acceleration energy of the ion implantation of a p-type impurity such as aluminum for forming the $p^{++}$-type contact region. Therefore, the thickness of the first portion may form a thin n-type shunt resistance region.

In the foregoing, the present invention is not limited to the embodiments described above and various modifications within a range not departing from the spirit of the invention are possible. For example, in the embodiments described above, while a case in which silicon carbide is used as a semiconductor material is described as an example, without limitation hereto, the invention is applicable to cases in which other than silicon carbide, a semiconductor having a bandgap wider than that of silicon such as gallium nitride (GaN) is used as the semiconductor material. The invention is similarly implemented when conductivity types (n-type, p-type) are reversed.

According to the invention described above, while the main current that flows from the second electrode, through the first and the second semiconductor layers, the inversion layer, the second semiconductor region, and the first semiconductor region and toward the first electrode is equal to or less than the rated current, the ON resistance may be set by adding the resistance value that is due to second semiconductor region to the ON resistance for the rated current, only when the predetermined ON resistance is maintained and the current becomes large and exceeds the rated current.

The semiconductor device according to the present invention achieves an effect in that ON resistance may be maintained and short circuit capability may be increased.

As described, the semiconductor device according to the present invention is useful for power semiconductor devices used in power conversion equipment and power supply devices of industrial machines, and is particularly suitable for semiconductor devices in which silicon carbide is used as a semiconductor material.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
    a semiconductor substrate containing a semiconductor material having a bandgap wider than that of silicon;
    a first semiconductor layer forming a back surface of the semiconductor substrate;
    a second semiconductor layer of the semiconductor substrate and being of a first conductivity type, the second semiconductor layer provided in contact with the first semiconductor layer and closer to a front surface side of the semiconductor substrate than is first semiconductor layer;
    a third semiconductor layer of a second conductivity type and forming a front surface of the semiconductor substrate, the third semiconductor layer being a portion of the semiconductor substrate excluding the first semiconductor layer and the second semiconductor layer;
    a first semiconductor region of the first conductivity type and selectively provided in the third semiconductor layer;
    a second semiconductor region of the first conductivity type and selectively provided in the third semiconductor layer, an impurity concentration of the second semiconductor region being lower than an impurity concentration of the first semiconductor region;
    a third semiconductor region of the second conductivity type, the third semiconductor region being a portion of the third semiconductor layer excluding the first semiconductor region and the second semiconductor region;
    a trench penetrating the third semiconductor layer from the front surface of the semiconductor substrate in a thickness direction and reaching the second semiconductor layer;

a gate electrode provided in the trench via a gate insulating film;

a first electrode provided at the front surface of the semiconductor substrate and electrically connected to the first semiconductor region and the third semiconductor region; and a second electrode provided at the back surface of the semiconductor substrate and electrically connected to the first semiconductor layer, wherein the first semiconductor region is disposed separated from the gate insulating film, and the second semiconductor region is provided between the first semiconductor region and an inversion layer of the first conductivity type formed, during ON operation, in a portion of the third semiconductor region opposing the gate electrode across the gate insulating film, the second semiconductor region being in contact with the first semiconductor region and the inversion layer.

2. The semiconductor device according to claim 1, wherein the second semiconductor region is disposed, positioned deeper toward the second electrode than is the front surface of the semiconductor substrate and shallower toward the first electrode than is the inversion layer, and reaches a position deeper toward the second electrode from the front surface of the semiconductor substrate than is the first semiconductor region.

3. The semiconductor device according to claim 1, wherein a thickness of the second semiconductor region is thinner than a thickness of the first semiconductor region.

4. The semiconductor device according to claim 1, wherein the second semiconductor region is in contact with an entire surface of the first semiconductor region facing toward the second electrode.

5. The semiconductor device according to claim 1, comprising a fourth semiconductor region of the second conductivity type and selectively provided in the third semiconductor layer, the fourth semiconductor region being electrically connected to the first electrode and having an impurity concentration higher than that of the third semiconductor layer, wherein the third semiconductor region is a portion of the third semiconductor layer excluding the first semiconductor region, the second semiconductor region, and the fourth semiconductor region, and the first semiconductor region and the fourth semiconductor region are disposed to repeatedly alternate each other in a direction parallel to the front surface of the semiconductor substrate and along which the trench extends in a linear shape.

6. The semiconductor device according to claim 5, wherein the fourth semiconductor region is disposed between the first semiconductor region and the gate insulating film, the second semiconductor region reaches a position deeper toward the second electrode from the front surface of the semiconductor substrate than is the fourth semiconductor region, and is in contact with a surface of the fourth semiconductor region on a side of the fourth semiconductor region facing toward the second electrode, closer to the gate insulating film than is the first semiconductor region.

7. The semiconductor device according to claim 6, wherein the impurity concentration of the second semiconductor region is lower than an impurity concentration of the fourth semiconductor region.

8. The semiconductor device according to claim 6, wherein the fourth semiconductor region is a second-conductivity-type spreading region, and the second semiconductor region has a first portion in contact with a surface of the fourth semiconductor region on a side of the fourth semiconductor region facing toward the second electrode, and a second portion separated further from the gate insulating film than is the first portion, a thickness of the first portion thinner than a thickness of the second portion.

9. The semiconductor device according to claim 8, wherein the thickness of the first portion of the second semiconductor region is in a range from 0.05 μm to 0.25 μm.

10. The semiconductor device according to claim 1, comprising:

a first second-conductivity-type region selectively provided in the second semiconductor layer, the first second-conductivity-type region separated from the third semiconductor region and opposing a bottom of the trench in a thickness direction;

a second second-conductivity-type region provided in the second semiconductor layer, the second second-conductivity-type region in contact with the third semiconductor region and separated from the trench and the first second-conductivity-type region; and a fifth semiconductor region of the first conductivity type selectively provided in the second semiconductor layer, the fifth semiconductor region provided closer to the second electrode than is the second second-conductivity-type region, and opposing the second second-conductivity-type region in the thickness direction.

11. The semiconductor device according to claim 10, comprising a sixth semiconductor region in a surface layer of the second semiconductor layer on a side of the second semiconductor layer bordering the third semiconductor layer, the sixth semiconductor region being of the first conductivity type and having an impurity concentration higher than that of the second semiconductor layer, wherein the bottom of the trench terminates in the sixth semiconductor region, and the first second-conductivity-type region and the second second-conductivity-type region are selectively provided in the sixth semiconductor region.

12. The semiconductor device according to claim 1, wherein the impurity concentration of the second semiconductor region is in a range from $1\times10^{17}/cm^3$ to $1\times10^{19}/cm^3$.

13. The semiconductor device according to claim 1, wherein the impurity concentration of the second semiconductor region is in a range from $4\times10^{17}/cm^3$ to $3\times10^{18}/cm^3$.

14. The semiconductor device according to claim 1, wherein the impurity concentration of the first semiconductor region is in a range from $3\times10^{19}/cm^3$ to $3\times10^{20}/cm^3$.

* * * * *